United States Patent
Schiefele

(10) Patent No.: US 6,314,416 B1
(45) Date of Patent: Nov. 6, 2001

(54) RECONFIGURABLE EXPERT RULE PROCESSING SYSTEM

(75) Inventor: Walter P. Schiefele, Sebastian, FL (US)

(73) Assignee: Interface & Control Systems, Inc., Columbia, MD (US)

( * ) Notice: Subject to any disclaimer, the term of this patent is extended or adjusted under 35 U.S.C. 154(b) by 0 days.

(21) Appl. No.: 09/193,233

(22) Filed: Nov. 17, 1998

(51) Int. Cl.[7] .................................................. G06F 9/445
(52) U.S. Cl. .............................................................. 706/60
(58) Field of Search ...................................... 706/60, 47.1

(56) References Cited

U.S. PATENT DOCUMENTS

| | | | |
|---|---|---|---|
| 4,928,236 | * 5/1990 | Tanaka et al. | 706/59 |
| 5,027,305 | * 6/1991 | Tanaka et al. | 706/48 |
| 5,218,669 | * 6/1993 | Kobayashi et al. | 706/47 |
| 5,301,260 | * 4/1994 | Miyashita | 706/50 |
| 5,331,565 | * 7/1994 | Hattori et al. | 700/28 |
| 5,487,134 | * 1/1996 | Ballard | 706/46 |
| 5,493,508 | * 2/1996 | Dangele et al. | 716/5 |
| 5,541,832 | * 7/1996 | Nakajima et al. | 70/28 |
| 5,619,621 | * 4/1997 | Puckett | 706/47 |
| 5,751,914 | * 5/1998 | Colet et al. | 706/47 |
| 5,778,155 | * 7/1998 | Hepner | 706/47 |
| 5,870,730 | * 2/1999 | Furuya et al. | 706/47 |
| 6,052,680 | * 4/2000 | Towell | 706/47 |

* cited by examiner

Primary Examiner—Mark R. Powell
Assistant Examiner—Michael B. Holmes
(74) Attorney, Agent, or Firm—Rosenberg, Klein & Lee

(57) ABSTRACT

There is provided a reconfigurable computing system (10) for performing both script and rule processing. Reconfigurable computing system (10) generally includes a script processing module (100); a reconfigurable rule processing module (200); and a controller module (300). Reconfigurable rule processing module (200) includes a working memory portion (210a, 210b), a rule evaluation portion (230), and an interconnection portion (220, 222) for coupling together the working memory (210a, 210b) and rule evaluation (230) portions. The rule evaluation portion (230) is formed by a plurality of inference cells, each of which is configured to generate an inference signal responsive to at least a portion of an input signal. Controller module (300) which is coupled to both script processing module (100) and rule processing module (200) is capable of automatically actuating reconfiguration of rule processing module (200) in accordance with predetermined processing logic. Controller module (300) is adapted to generate configuration control data for this purpose.

28 Claims, 26 Drawing Sheets

```
rule        AND_GATE
subsystem   WHITE_PAPER
category    LOGIC_EQUIVALENCE
priority    20
activation  YES
continuous  YES
if          X1=1 and X2=1 and ... Xn=1 then
            Y=1
else
            Y=0
end if
end AND_GATE
```

```
rule        OR_GATE
subsystem   WHITE_PAPER
category    LOGIC_EQUIVALENCE
priority    20
activation  YES
continuous  YES
if          X1=1 or X2=1 or ... Xn=1 then
            Y=1
else
            Y=0
end if
end OR_GATE
```

```
rule        NAND_GATE
subsystem   WHITE_PAPER
category    LOGIC_EQUIVALENCE
priority    20
activation  YES
continuous  YES
if          X1=0 or X2=0 or ... Xn=0 then
                Y=1
else
                Y=0
end if
end NAND_GATE
```

```
rule        NOR_GATE
subsystem   WHITE_PAPER
category    LOGIC_EQUIVALENCE
priority    20
activation  YES
continuous  YES
if          X1=0 and X2=0 and ... Xn=0 then
                Y=1
else
                Y=0
end if
end NOR_GATE
```

EXCLUSIVE OR GATE

| | |
|---|---|
| rule | EX_OR_GATE |
| subsystem | WHITE_PAPER |
| category | LOGIC_EQUIVALENCE |
| priority | 20 |
| activation | YES |
| continuous | YES | if    (X1=0 and X2=1) or (X1=1 and X2=0) then
      Y=1
else
      Y=0
end if
end EX_OR_GATE

D FLIP FLOP

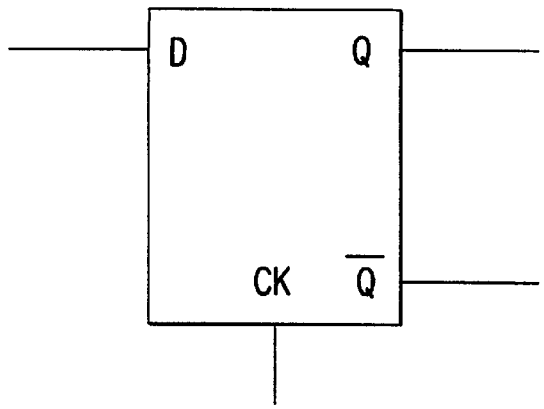

```
rule            D_FLIP_FLOP_0
subsystem       WHITE_PAPER
category        LOGIC_EQUIVALENCE
priority        20
activation      YES
continuous      YES
if ck_old = 0 and ck_new=1 and d=0 then
        q_old = q_new
        q_new = 0
        q_prime_old = q_prime_new
        q_prime _new = 1
end if
end D_FLIP_FLOP_0 rule            D_FLIP_FLOP_1
subsystem       WHITE_PAPER
category        LOGIC_EQUIVALENCE
priority        20
activation      YES
continuous      YES
if ck_old = 0 and ck_new=1 and d=1 then
        q_old = q_new
        q_new = 1
        q_prime_old = q_prime_new
        q_prime _new = 0
end if
end D_FLIP_FLOP_1
```

FIG. 1F

JK FLIP FLOP

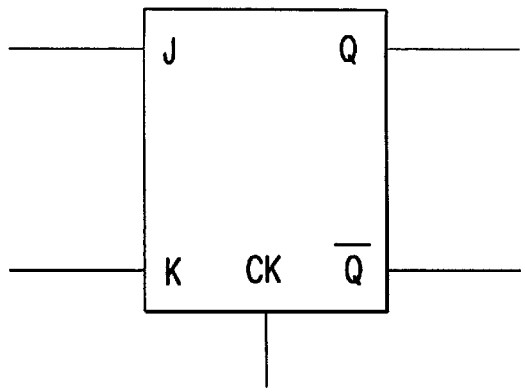

```
rule        JK_FLIP_FLOP_0
subsystem   WHITE_PAPER
category    LOGIC_EQUIVALENCE
priority    20
activation  YES
continuous  YES
if ck_old = 0 and ck_new=1 and ((j=1 and j=0) or (j=1 and k=1
            and q_old=1)) then
            q_old = q_new
            q_new = 0
            q_prime_old = q_prime_new
            q_prime_new = 1
end if
end JK_FLIP_FLOP_0 rule        JK_FLIP_FLOP_1
subsystem   WHITE_PAPER
category    LOGIC_EQUIVALENCE
priority    20
activation  YES
continuous  YES
if ck_old = 0 and ck_new=1 and ((j=0 and j=1) or (j=1 and k=1
            and q_old=0)) then
            q_old = q_new
            q_new = 1
            q_prime_old = q_prime_new
            q_prime_new = 0
end if
end JK_FLIP_FLOP_1
```

FIG. 1G

```
rule              COMPARATOR
subsystem         WHITE_PAPER
category          LOGIC_EQUIVALENCE
priority          20
activation        YES
continuous        YES
if V2>V1  then
                  V0=1
else
                  V1=0
end if
end COMPARATOR
```

```
MODULE ExampleHDL;
    VAR
        tel:[24] BIT;          (* Input telemetry frame input register         *)
        telPrev:[24] BIT;      (* same as above except delayed by 1 clock      *)
        V0:[32] BIT;           (* decomed analog raw value output register     *)
        D0:[32] BIT;           (* decomed discrete raw value output register   *)
        V1:[32] BIT;           (* decomed analog raw value output register     *)
        D1:[32] BIT;           (* decomed discrete raw value output register   *)
        RTCO:[4] BIT;          (* telemery change detection output register    *)
        Rules:[2] BIT;         (* current rule status output register          *)
        prevRules:[2] BIT;     (* same as above except delayed by 1 clk cycle  *)
        firedRules:[2] BIT;    (* rule change detection output register        *)
    BEGIN
    (*---- Protected register of telemetry bits, loadable with a direct
            register write.                             ---------------*)
    For i:=0..23 DO
        tel[i] := REG(tel[i]);
    END;

(* ---------- Decom telemetry frame into its SCL raw value registers ---*)
        V0[0] :=   REG(tel[10]);
        V0[1] :=   REG(tel[11]);
        V0[2] :=   REG(tel[12]);
        V0[3] :=   REG(tel[13]);

D0[0] :=   REG(tel[14]);

V1[0] :=   REG(tel[15]);
        V1[1] :=   REG(tel[16]);
        V1[2] :=   REG(tel[17]);
        V1[3] :=   REG(tel[18]);

D1[0] :=   REG(tel[19]);

(* Make sure all unused bits are zero *)
    FOR i:=4 .. 31 DO
            V0[i] := '0;
            V1[i] := '0;
    END;
    FOR i:=1..31 DO
            D0[i] := '0;
            D1[i] := '0;
    END;
    (* ------------ Implement telemetry change detection ---------------- *)
    RTCO[0] := (tel[10]-telPrev[10])+(tel[11]-telPrev[11])+
            (tel[12]-telPrev[12])+(tel[13]-telPrev[13]);
    RTCO[1] := (tel[14]-telPrev[14]);
    RTCO[2] := (tel[15]-telPrev[15])+(tel[16]-telPrev[16])+
            (tel[17]-telPrev[17])+(tel[18]-telPrev[18]);
    RTCO[3] := (tel[19]-telPrev[19]);

(* ------------ Save telemetry frame for change detection ------------*)
    FOR i :=0..23 DO
            telPrev[i] := REG(tel[i]);
    END;
```

FIG. 3D-1

```
(* ------------ Process Rules ---------------------------------- *)
  Rules[0] := ~((V0[0]-V1[0])+(V0[1]-V1[1])+(V0[2]-V1[2])+(V0[3]-V1[3]));
  Rules[1] := (~D0[0]) * D1[0];

(* ------------ Rule Fire Detection ---------------------------- *)

firedRules[0]:= (~prevRules[0]) * Rules[0];
  firedRules[1]:= (~prevRules[1]) * Rules[1];
  prevRules[0]:= REG(Rules[0]);
  prevRules[1]:= REG(Rules[1]);

END ExampleHDL.
```

FIG. 3D-2

RECONFIGURABLE EXPERT RULE PROCESSING SYSTEM

BACKGROUND OF THE INVENTION

1. Field of the Invention

The subject reconfigurable expert rule computing, or processing, system is generally directed to a processing system for use in artificial intelligence applications. More specifically, the subject reconfigurable expert rule processing system is directed to a highly flexible system for substantially real-time processing of data in rule based expert system applications. The emerging technological field of reconfigurable computing is requiring innovative methodologies. The subject reconfigurable expert rule processing system generally addresses this need.

With their inherent capacity to perform extremely complex operations, rule based expert systems find application in numerous control systems. They find application, for instance, in automated game control, in automated spacecraft command and control, and the like. The complexity of those control systems are such that a great number of inference rules are necessarily processed in carrying out the required control functions. Given the Von Neuman architecture invariably employed in the host processors of typical control systems, the number of inference rules to be processed yields a sufficiently great computational load to often render real time processing thereof impracticable. While real time processing may be realized with the benefit of a massive computing capability, such would be in most applications prohibitively costly, not only in terms of monetary expenses, but also in terms of electrical and mechanical resources consumed. Hence, a significant need is present for a rule based expert processing system that is realizable within the cost and operational constraints typically found in various control system applications.

Computational efficiency may be enhanced, often by orders of magnitude, through hardware implementation of combinational logic in corresponding circuits of interconnected logic gates. Indeed, it has long been a known practice in the prior art to implement logic circuits in such hardwired devices as dedicated controllers, switching circuits, and state machines. The practice of implementing logic in hardware led to the emergence of the relatively costly, yet widely accepted, practice of utilizing application specific integrated circuits (ASIC) for certain applications.

Over the past two decades, there has also emerged programmable logic devices on which the desired circuit configuration may be 'burned' in by a user. Advanced forms of such programmable logic devices afford the option of erasing the 'burned' in configuration, via either ultraviolet or electrical means. Like ASICs and other dedicated hardware devices, however, such programmable logic devices—even erasable ones—offer very little flexibility to the user. Where reconfiguration of the implemented circuit becomes necessary, the user must take significant reconfiguration measures that invariably require human intervention, else replace the given device altogether with one hardwired with the desired configuration.

In more recent years, dynamically programmable logic devices have emerged wherein automatic reconfiguration may be effected by passing appropriate control signals thereto. Latest generations of the field programmable gate array (FPGA) produced by Xilinx Corporation of San Jose, Calif. and the complex programmable logic device (CPLD) produced by Altera Corporation of San Jose, Calif., for instance, provide an on-board memory portion to which a configuration code may be provided. Configuration is then automatically effected by the device in accordance with that code. In the emerging field of reconfigurable computing, plug-in peripheral boards are now commercially available for personal computers that provide reconfiguration co-processing. These boards, commercially available from such companies as Virtual Computer Corporation of Reseda, Calif., and Giga Operations Corporation of Berkeley, Calif., interface with a personal computer memory bus to provide convenient memory-mapped I/O. Such boards support the subject reconfigurable expert rule processing system. Attempts have been made in the prior art to optimize the computational efficiency in systems requiring expert rule processing. These attempts have ranged from delineating a processor in a given system to serve exclusively as an inference engine to implementing select portions of the required rule processing functions in dedicated, hardwired circuitry. Such attempts have yielded varying degrees of success in accelerating the required rule processing. In control systems of even modest practicality, however, efficient processing is necessary for both rules—conditional commands or actions inferentially generated responsive to particular input signal components, and scripts—procedural command or instruction sequences to be carried out in time or procedure-based manner. Prior art approaches fail to provide a comprehensive mechanism by which efficient, coordinated processing of both rules and scripts may be realized. Furthermore, prior art approaches fail to provide such a comprehensive mechanism which is sufficiently reconfigurable to significantly enhance the performance and cost effectiveness of the resulting control system.

2. Prior Art

Expert rule processing systems are known, as are devices containing hardwired implementations of combinational logic circuits and dynamically programmable devices for performing such implementation. The best prior art references known to Applicant include U.S. Pat. Nos. 5,487,134; 5,077,677; 5,481,649; 5,072,442; 5,561,738; 5,737,235; 4,910,669; 4,551,814; 5,717,928; 5,379,387; 5,499,192; 5,574,655; 5,077,656; 5,615,309; 4,901,229; 5,673,198; 5,140,526; 5,365,514; 5,259,066; 5,487,134; 5,638,493; and, 5,428,525. There is no system heretofore known, however, which comprehensively provides in readily reconfigurable manner efficient processing of both rules and scripts in system applications employing rule based expert system architectures.

SUMMARY OF THE INVENTION

It is a primary object of the present invention to provide a reconfigurable processing system for comprehensively performing the processing functions of a rule based expert processing system in computationally efficient manner.

It is another object of the present invention to provide such a reconfigurable processing system which is conveniently operable and highly cost effective.

It is a further object of the present invention to provide a reconfigurable processing system capable of synchronizing and/or interleaving the processing of both scripts and rules of a given system.

It is yet another object of the present invention to provide a reconfigurable processing system which employs a substantially modular expert rule co-processor cooperatively operable with a host processor typically, though not necessarily, characterized by either a Von Neuman or Harvard architecture.

It is still another object of the present invention to provide a reconfigurable processing system wherein rule based expert system logic is reconfigurably implemented in corresponding hardwired combinational logic circuitry.

These and other objects are attained in a reconfigurable processing system realized in accordance with the present invention for processing an input signal. The subject reconfigurable processing system generally comprises: a first processing module for executing a script instruction responsive to at least a portion of the input signal and generating a first output signal; and a reconfigurable second processing module for executing a rule based evaluation responsive to at least a portion of the input signal and generating a second output signal; and, a controller module coupled to the first and second processing modules for actuating cooperative operation thereof. The reconfigurable second processing module includes a working memory portion for temporary storage of at least a portion of the input signal and at least a portion of the second output signal. It also includes a rule evaluation portion having a plurality of inference cells disposed in parallel, wherein each of the inference cells is configured to generate an inference signal responsive to at least a portion of the input signal. The second processing module includes, as well, an interconnection portion for coupling together the working memory and rule evaluation portions.

The controller module is capable of automatically actuating reconfiguration of the second processing module in accordance with predetermined processing logic. The controller module is adapted to generate for the second processing module configuration control data.

BRIEF DESCRIPTION OF THE DRAWINGS

FIG. 1F is a schematic diagram illustrating the correspondence between exemplary rules and a D-type flip-flop;

FIG. 1G is a schematic diagram illustrating the correspondence between exemplary rules and a JK-type flip-flop;

FIG. 3D is a listing of a sample HDL file generated in an exemplary application of one embodiment of the present invention;

DETAILED DESCRIPTION OF THE PREFERRED EMBODIMENTS

Figure 1A:
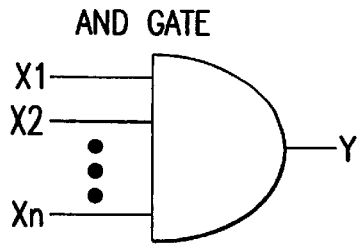
FIG. 1A is a schematic diagram illustrating the correspondence between an exemplary rule and an AND gate.
Figure 1B:
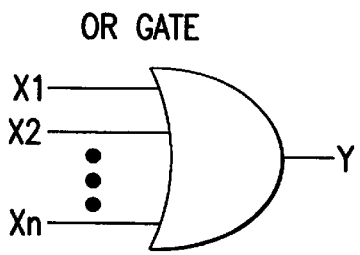
FIG. 1B is a schematic diagram illustrating the correspondence between an exemplary rule and an OR gate.
Figure 1C:
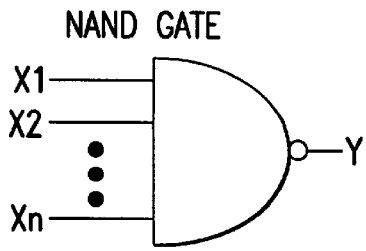
FIG. 1C is a schematic diagram illustrating the correspondence between an exemplary rule and a NAND gate.
Figure 1D:
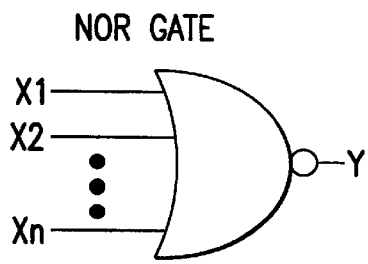
FIG. 1D is a schematic diagram illustrating the correspondence between an exemplary rule and a NOR gate.
Figure 1E:
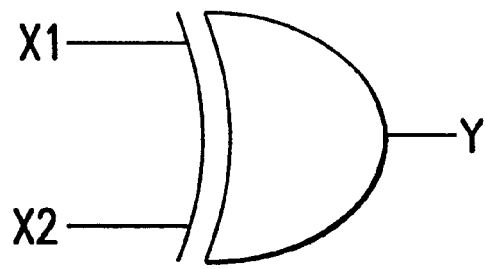
FIG. 1E is a schematic diagram illustrating the correspondence between an exemplary rule and an EXCLUSIVE OR gate.
Figure 1H:
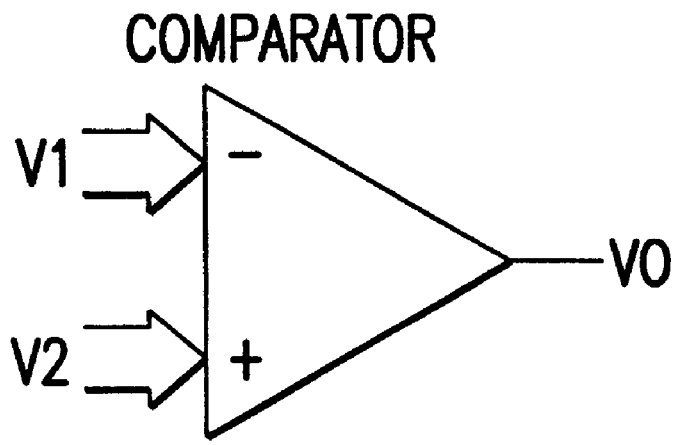
FIG. 1H is a schematic diagram illustrating the correspondence between an exemplary rule and a comparator.

The direct hardware implementation of expert system rule processing logic is predicated on the simple, yet not well-exploited, notion that every inferential rule employed in a given expert system is characterized by direct correspondence to an equivalent digital logic circuit element. This equivalence of rules to logic circuit elements, is illustrated in FIGS. 1A–1H which show for illustrative purposes exemplary circuit elements which may be utilized as building blocks in implementing complex rule sets. The basic logic circuit elements shown—an AND gate, an OR gate, a NAND gate, a NOR gate, an exclusive OR gate, a D-flip-flop, a JK flip-flop, and a comparator—are each shown with their corresponding rules. The rules are described in System Control Language (SCL) syntax (also known as Spacecraft Command Language) developed by Interface & Control Systems, Inc. of Columbia, Md. This particular syntax is shown here and elsewhere in this document for illustrative purposes only, the choice of syntax format associated with the rules employed not being important to the present invention, except to the extent noted herein.

Upon obtaining logic gate definitions of the type shown in FIGS. 1A–1H for each rule in a given rule set, the resulting logic elements may be interconnected in parallel and/or cascaded to directly implement the entire rule set in hardware. The resulting combinational logic circuit may be realized on such platforms as a XC40125 or XC6216 FPGA chip produced by Xilinx Corporation of San Jose, Calif., a FLEX 10k CPLD chip produced by Altera Corporation, also of San Jose, Calif., and other comparable devices. Each of these devices provides an array of cells which may be configured as necessary to form desired logic circuitry. Each also provides an onboard static random access memory (SRAM) portion with the necessary interface means to allow an external source to store configuration code thereon. When properly actuated, suitable means provided in each device carries out the configuration prescribed by the code stored in the SRAM portion. As the details of operation pertaining to each such programmable device is well-documented by its respective manufacturer, further description in that regard will not be provided herein.

An important feature maintained in a reconfigurable processing system in accordance with the present invention is that of performing both rule and script processing. The capability is particularly important for control applications wherein coordinated processing of rules and scripts provides convenient programmability in the controller. In completely rule based systems of the prior art, execution of even the most basic non-inferential steps such as simple startup procedures and sequences are effected by a programmed rule-based state machine. Such rule-based state machine operations introduce undue complexity to system operation. In contrast, the subject reconfigurable expert rule processing system processes scripts in the execution of timing, scheduling, sequencing, and other such operations; while it processes rules only for executing event-driven, inferential operations such as sensor detection and reaction.

Figure 2:
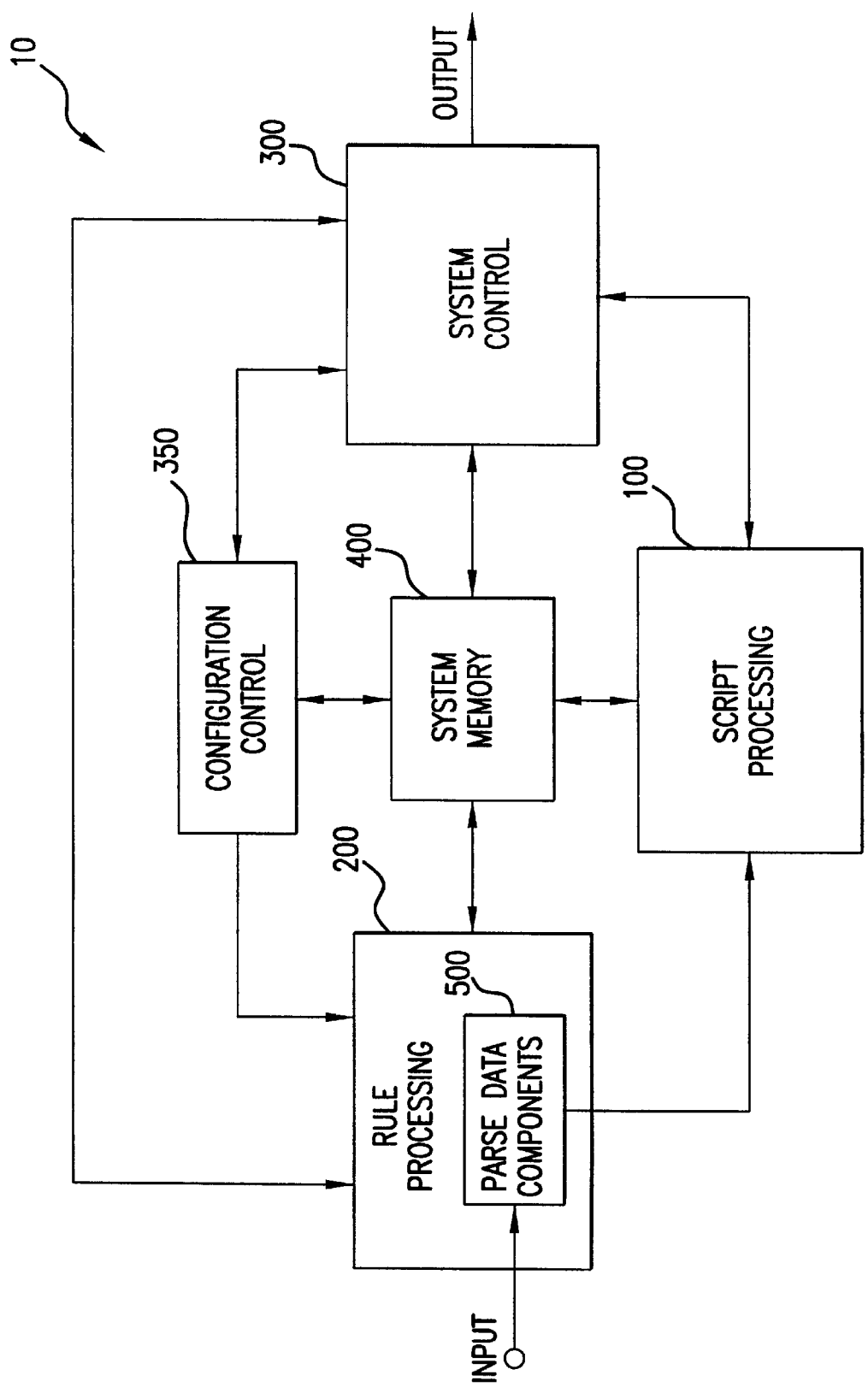
FIG. 2 is a schematic block diagram generally illustrating the functional components of an embodiment of the present invention.

Turning now to FIG. 2, there is shown a schematic block diagram illustrating in broad concept the functional components of a reconfigurable processing system 10 formed in accordance with the present invention. Reconfigurable processing system 10 generally includes a script processing module 100 and a rule processing module 200 controlled by a system controller 300. Coupled to system controller module 300 is a configuration control portion 350 by which the necessary rule-to-logic circuit element conversion and other steps necessary for fully configuring rule processing module 200 are carried out, and by which the necessary interface signals and actions are applied to rule processing module 200. Each of the processing modules 100, 200 and system controller module 300 is coupled for access to a system memory module 400 representing generally both permanent and temporary storage elements for system-level data including, but not limited to, rule set descriptions, script sequences, application specific parameters, configuration code formats, and data parsing criteria.

Reconfigurable processing system 10 also includes a parsing component 500 whereby the data components for script and rule processing received in the input data stream are parsed for appropriate application to script and rule processing modules 100, 200. Parsing component 500 is shown within rule processing module 200, for its functions may be conveniently carried out in certain embodiments by the reconfigurable working memory and interconnection portions of processing module 200 described in following paragraphs. Parsing component 500—thus readily formed by appropriate configuration of rule processing module 200—is highly desirable in systems operating on bit stream type input data.

Turning more specifically to parsing component 500, a change in input data format and/or transmission protocol will often necessitate a corresponding change in data parsing criteria. Ready reconfigurability of the parsing function, thus realized, would minimize the potentially significant disruptions to system operation that might otherwise result.

In exemplary applications such as spacecraft command and control, the given spacecraft includes numerous subsystems requiring active control such as navigation control, attitude control, solar array and battery power management, communications configuration, and payload control. Invariably, each sub-system's design and operational constraints require the use of a distinct telemetry, or bit stream, format in the transfer of data to and/or from that sub-system. A parsing component compatible with one format would not necessarily be compatible with any of the other formats, as parsing criteria is necessarily determined by the given format. Reconfigurability of the parsing component, therefore, significantly enhances dynamic operability of the overall system where such variability in data stream format is necessarily encountered.

In space command and control applications, input data is often received serially in bit-stream packets that form a sequence of predefined telemetry frames. Parsing component 500 parses elements of the received data stream for use in either rule processing or script processing. Any suitable means known in the art may be employed for performing such parsing, or 'decommutation' operation, as it is commonly referred to in the aerospace art. The criteria on which the parsing is based will depend on the particularities of the given application and, therefore, are not important to the present invention. In any case, the necessary parsing criteria stored in system memory 400 is preferably retrieved and applied to parsing component 500 by system controller 300.

In an exemplary application of reconfigurable processing system 10, decommutation of the incoming telemetry data is performed as one stage of a telemetry reduction process. The telemetry reduction process actually entails a number of stages including: telemetry validation wherein sync pattern verification, checksum, and frame identification are performed; decommutation of each telemetry frame into its data components; change detection whereby those components of the given frame having undergone a change since the immediately preceding frame are detected; telemetry limit check; and, necessary conversion of raw empirical values to appropriate engineering values. At least the first four of these stages preferably occur within parsing component 500. If sufficient resources are available in the programmable device employed in the given embodiment, some or all of the remaining steps may occur within parsing component 500. Stages not included in 500 may most expeditiously be performed within controller module 300.

Figure 2A:
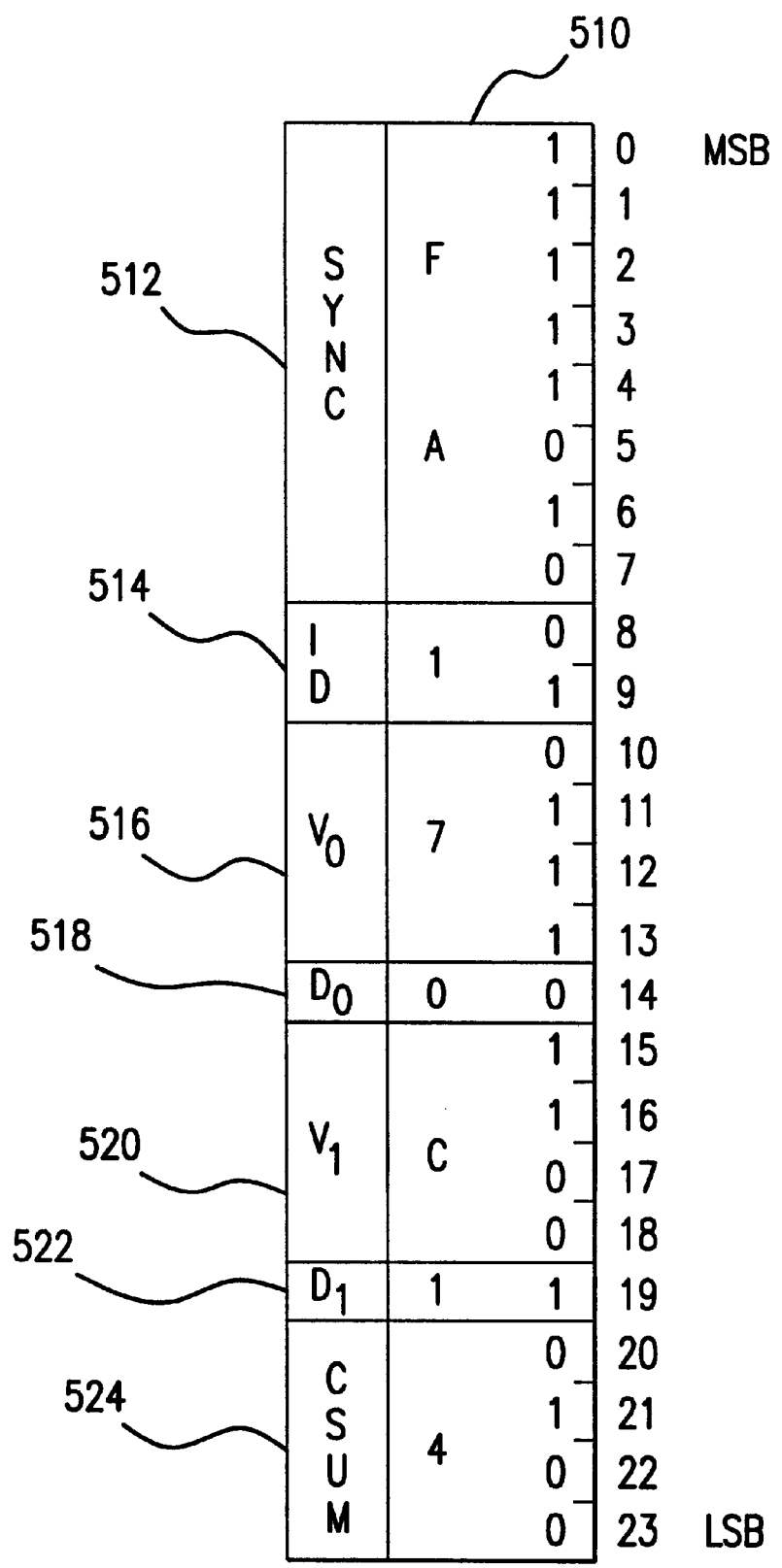
FIG. 2A is a data packet diagram illustrating a telemetry frame format in an exemplary application of one embodiment of the present invention.

For illustrative purposes, an example of a telemetry frame 510 that may be employed in an exemplary SCL system is depicted in FIG. 2A. The telemetry frame 510 shown includes among its constituent parts a sync pattern 512, a frame identifier 514, a first voltage value 516, a first discrete element 518, a second voltage value 520, a second discrete element 522, and a checksum 524. Proper reduction of this telemetry frame example is automatically effected (where parsing component 500 is reconfigurably formed within rule processing module 200) in accordance with a template definition file (TDF) read by configuration control module 350 during configuration of rule processing module 200.

In accordance with the present invention, rule processing module 200 is readily configurable under the ultimate control of system controller module 300. The programmable device employed is preferably one that is equipped with a programming port through which a configuration control signal may be passed thereto. Known programmable devices of the type indicated in preceding paragraphs are adapted to recognize and respond to configuration code of one or more predetermined format. Configuration control module 350, coupled as shown to system controller module 300, receives therefrom the software expert system rules to be applied by rule processing module 200 and the information necessary to properly configure parsing component 500.

The subject expert rule processing system preferably utilizes a suitable microprocessor having either a Von Neuman or Harvard architecture, along with a suitable programmable device such as an FPGA or CPLD. Script processing, due to its procedural properties, is well handled by the microprocessor since the microprocessor is a sequential machine. Rule processing, by comparison, requires parallel event processing and, for this reason, is best accomplished in the FPGA or CPLD device. It is worthwhile to note, that the FPGA or CPLD device provides an extremely wide internal data bus which enables the subject expert reconfigurable processing system to achieve high through-put processing rates.

Although the functional components of reconfigurable processing system 10 are delineated in distinct blocks for conceptual clarity, it is to be understood that one or more of the functional components shown may actually reside in a common device. For instance, system controller 300, configuration control module 350, and script processing module 100, along with at least a portion of system memory 400, may be implemented in a common microprocessor device.

Figure 3:
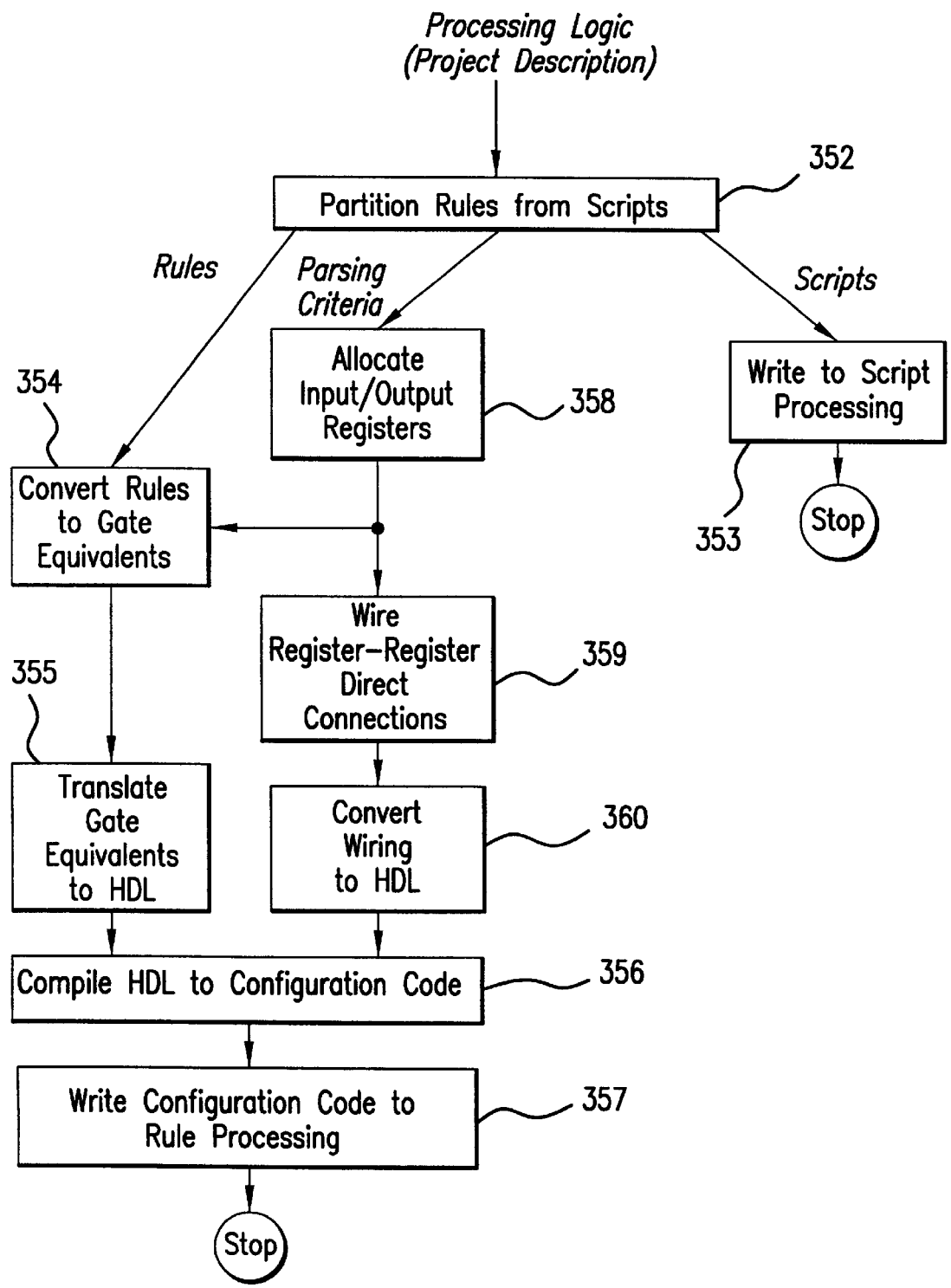
FIG. 3 is a block flow diagram illustrating a configuration control function in an embodiment of the present invention.

Turning now to FIG. 3, there is shown a flow diagram illustrating the steps generally performed within configuration control module 350 in one embodiment of the present invention. The given system application's processing logic is initially passed to block 352 wherein any scripts prescribed in the necessary processing are partitioned from the rules and any parsing or decommutation criteria (and related information) prescribed therein. The scripts are passed to block 353 where they are written to script processing module 100. Script processing module 100 is programmed accordingly to execute the partitioned scripts.

The rules partitioned at block 352 are passed to block 354 wherein they are converted to their gate equivalents, in much the manner illustrated in FIGS. 1A–1H. The flow progresses to block 355 wherein the resulting gate equivalents are translated to their corresponding expression in a suitable Hardware Description Language (HDL) known in the art, such as Logic Language (LoLa), Verilog, VHDL, and the like. The HDL translation of the given rule gate equivalents is thereafter compiled at block 356 utilizing a suitable compiler (that may also be known in the art) to obtain a configuration code having a format compatible with the given programmable device of rule processing module 200. As indicated by block 357, the configuration code thus generated is next written to rule processing module 200 for the module's subsequent reconfiguration in accordance therewith.

The partitioning process occurring at block 352 generates parsing (i.e., decommutation) criteria to be applied to the incoming telemetry data flow. This criteria is passed to block 358 wherein the necessary input and output registers are allocated and information pertaining to that allocation such as the location, number of bits, and register grouping is generated. Such register definition information is utilized in generating rule to gate equivalents at block 354, and in generating parsing interconnections at block 359.

Figure 2B:
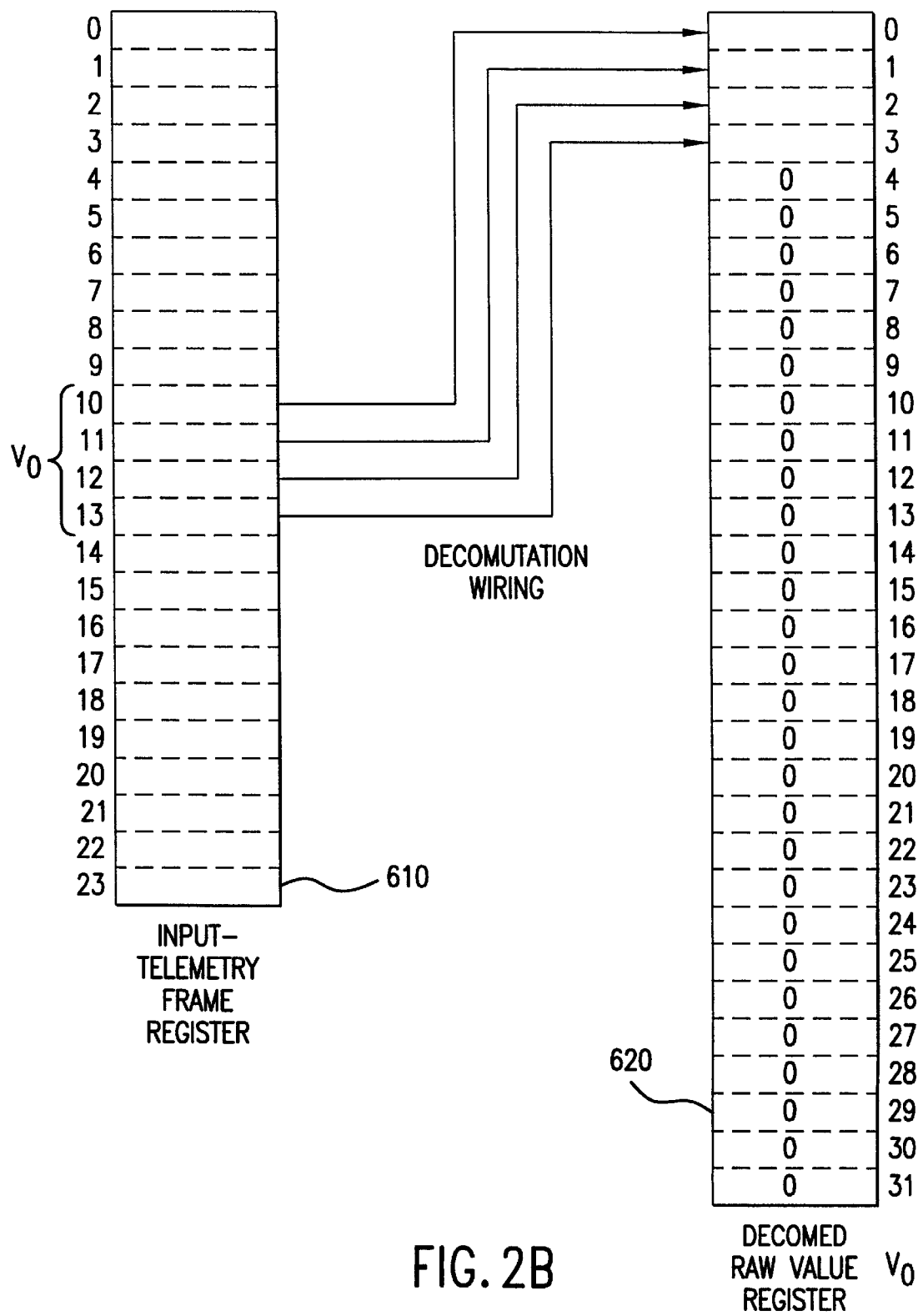
FIG. 2B is a schematic diagram illustrating an exemplary interconnection configuration for parsing telemetry data.

Parsing interconnections provide bit mappings from an input telemetry register to an output register. Physically, this is accomplished by wiring individual bits of the input telemetry register to the proper output register. The bit group in the input telemetry register is typically contiguous. Further, the output register least significant bit necessarily corresponds to the least significant bit of the extracted bit group. FIG. 2B shows an exemplary parsing configuration for the telemetry frame of FIG. 2A in which the group of bits for element VO is extracted from input telemetry register 610, then transferred to the output register 620. In accomplishing the transfer, the bit group is offset so that the least significant bit of the group corresponds to the least significant bit of register 620. Also note the output register 620 is required to be 32 bits due to the memory bus interface with the CPU. For this reason, upper bits of the register not wired to the input register are zero filled. The wiring information is then converted to HDL at block 360 and compiled thereafter to the appropriate configuration code at block 356. The configuration code is then written at block 357 to rule processing module 200 to configure parsing component 500.

The functional steps shown in FIG. 3 may be illustrated in an exemplary system application utilizing a plurality of source files generated in SCL syntax. In the system application, the system's processing logic (or project description) accesses for input to the partitioning function a telemetry definition file, a rule source file, and a script source file. Examples of each such file corresponding to the telemetry frame format defined in FIG. 2A are shown below. Note that the exemplary files are shown purely for illustrative purposes, and their specific description should not be construed in any way to limit the scope of the present invention.

---------------------TDF FILE---------------------

```
data DCOM, 1   , "TLM FRAME" --Decom resid 1
    numRecords = 4
    recordID = 3 --V0 Analog Sensor
    startBit = 10
    numBits = 4
    recordID = 4 --D0 Discrete Sensor
    startBit = 14
    numBits = 1
    recordID = 5 --V1 Analog Sensor
    startBit = 15
    numBits = 4
    recordID = 6 --D1 Discrete Sensor
    startBit = 19
    numBits = 1
end DCOM
data RTAS, 3   --V0 Analog Sensor
    rawValue = 0
end RTAS
data RTDS, 4   --D0 Discrete Sensor
    rawValue = 0
end RTDS
data RTAS, 5   --V1 Analog Sensor
    rawValue = 0
end RTAS
data RTDS, 6   --D1 Discrete Sensor
    rawValue = 0
end RTDS
```

---------------------SCL RULES---------------------

```
rule TestVoltages
subsystem Example1
category PatentApplication
priority 20
activation YES
continuous YES
```

-continued

```
if V0=V1 then
    msg "First Rule Fired"
    execute VoltageWarning
end if
end TestVoltages
rule TestDiscretes
subsystem Example1
category PatentApplication
priority 20
activation YES
continuous YES
if D0 = 0 AND D1=1 then
    then
        msg "Second Rule Fired"
        CEXL CNTL_PKT
    end if
end TestDiscretes
```

--------------------SCL SCRIPTS--------------------

```
script VoltageWarning  --This script is invoked by a rule
    msg "V0 is equal to V1"
    wait 20 seconds
end VoltageWarning
script LowVoltages  --Prints the various engineering values
of voltages
    msg "V0 = ", V0
    msg "V1 = ", V1
end LogVoltages
script LogDiscretes  --Prints the discrete sensors
    msg "D0 = ", D0
    msg "D1 = ", D1
end LogDiscretes
script MainScript  --Logs all database values
    global counter
    execute LogVoltages
    execute LogDiscretes
    counter = counter + 1
    CEXL RESET_WATCHDOG_PKT
end MainScript
script StartUpMainScript  --Main script for spawning
                          --child script
    execute MainScript every 10 sec
end StartUpMainScript
```

The illustrative template definition file (TDF file) includes a DCOM, or decommutation, record which defines the information according to which the telemetry frame is to be decoded. The DCOM record contains such information as the total number of elemental records within the given frame, identifiers for any data elements, and the start bit location and length in number of bits for each data element within the telemetry frame. The TDF file also includes telemetry sensor records which provide the information necessary for allocating SCL database output entries to be made upon decommutation. These records include such information as sensor type (analog or discrete) and the decommutated values and, in some applications, coefficient identifications for engineering conversion pertaining to each data element.

The illustrative SCL rule source file shown includes various rules to be applied during rule processing. The particular file shown includes two rules, a first rule which 'fires' when the voltage value of data element $V_0$ equals the voltage value for data element $V_1$, and a second rule which 'fires' when the state of data element $D_0$ is at a digital 0 state and that of data element $D_1$ is at a digital 1 state.

The illustrative SCL script source file shown contains the scripts to be executed during script processing. The file includes such scripts as: that invoked by the firing of a rule; that which executes the printing of various database values; and, that which controls the timing and sequence of certain other scripts.

Figure 3A:
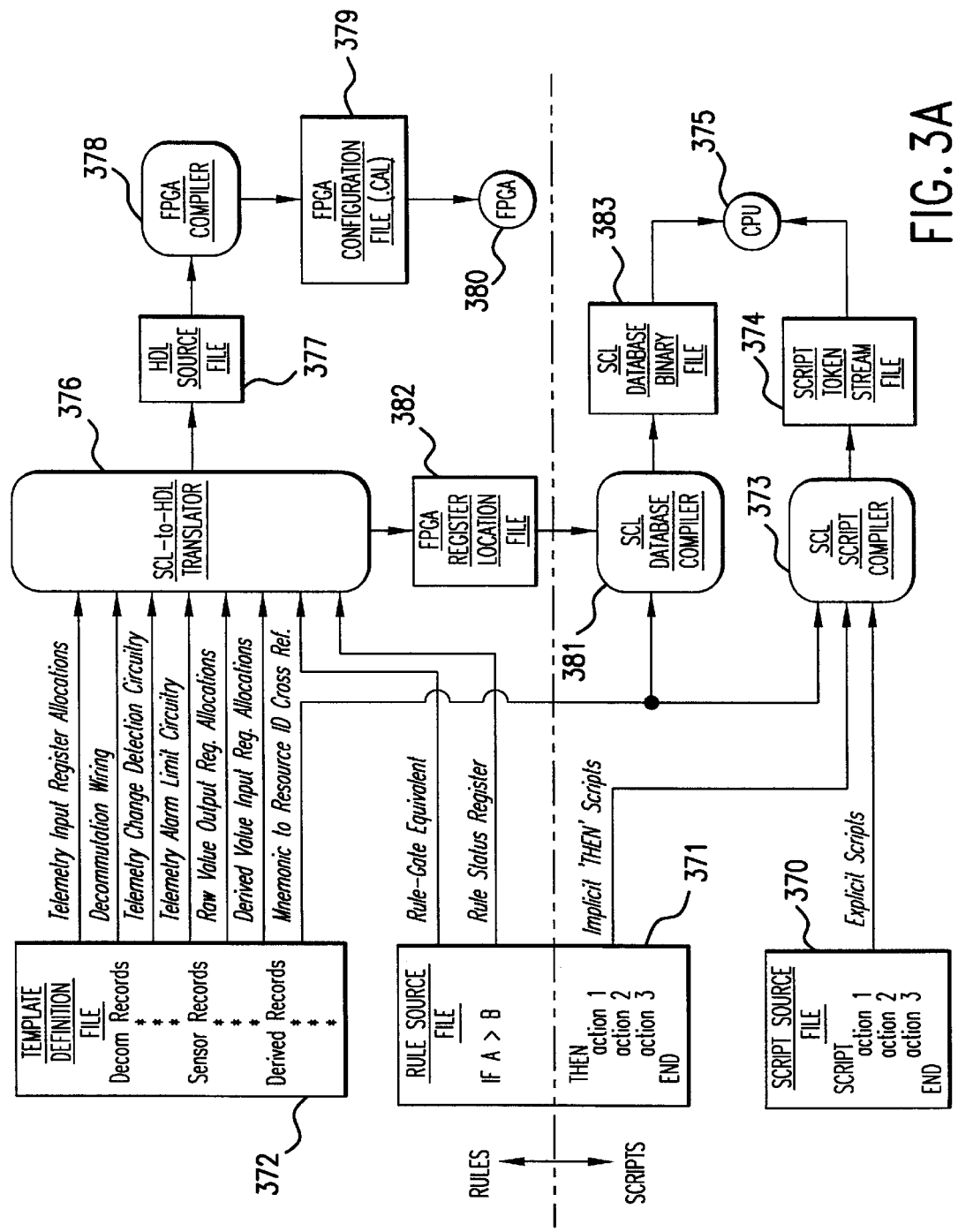
FIG. 3A is a schematic diagram illustrating one embodiment of the present invention in an exemplary SCL application.

The progression of steps shown in FIG. 3, as carried out in the given exemplary application, is shown in the schematic diagram of FIG. 3A. In this application, the script partition is formed by the contents of the script source file 370 and the 'THEN' portions of the rules set fourth in the SCL rule source file 371. The explicit scripts and implicit scripts derived respectively from these files 370, 371 are passed to an SCL script compiler 373 which generates a script token stream file 374. The script token stream file 374 is then passed to a controller 375 for execution.

The rule partition is formed in part by much of the SCL TDF file 372 contents and the 'IF' portions of the rules contained in the SCL rule source file 371. Records from the TDF file 372 relating to decommutation and sensor values are passed to an SCL-to-HDL translator 376 which then generates an HDL file 377. This HDL file is next passed to a compiler 378 of appropriate format to generate a configuration code file 379 compatible with the programmable device 380 on which rule processing module 200 is formed. The configuration code file 379 is thereafter written to the programmable device 380 to direct its reconfiguration. SCL-to-HDL translator 376 also generates a register location file 382 which enables controller 375 to find key registers in the programmable device 380. A summary of the conversion operations taking place during the steps schematically shown in FIG. 3A is provided in TABLE 1.

TABLE 1

| INPUT | CONVERSION TOOL | OUTPUT |
|---|---|---|
| SCL TDF Decom Records | SCL-HDL translator | -HDL Telemetry Input Register Allocations -HDL wiring between telemetry registers and raw value registers |
| SCL TDF Sensor Records | SCL-HDL translator | -HDL raw value output Register Allocations -HDL telemetry change detection hardware specification |
| SCL TDF Sensor Records | SCL Script Compiler | -Look-up table of Db mnemonics and SCL resids need by SCL script compiler |
| SCL TDF Derived Records | SCL-HDL translator | -HDL Derived Item Registers |
| SCL Rule Source File ("IF Section") | SCL-HDL translator | -HDL Rule-Gate Equivalents extracted from IF part of rule -HDL rule status register including rule firing detection |
| SCL Rule Source File ("THEN Section") | SCL Script Compiler | -The THEN portion of rules are represented as implicit script Token streams used by CPU |
| SCL Script Source File | SCL Script Compiler | -SCL token streams File used by the CPU |
| SCL TDF File | SCL Db Compiler | -SCL database binary file used by the CPU |

Figure 3B:
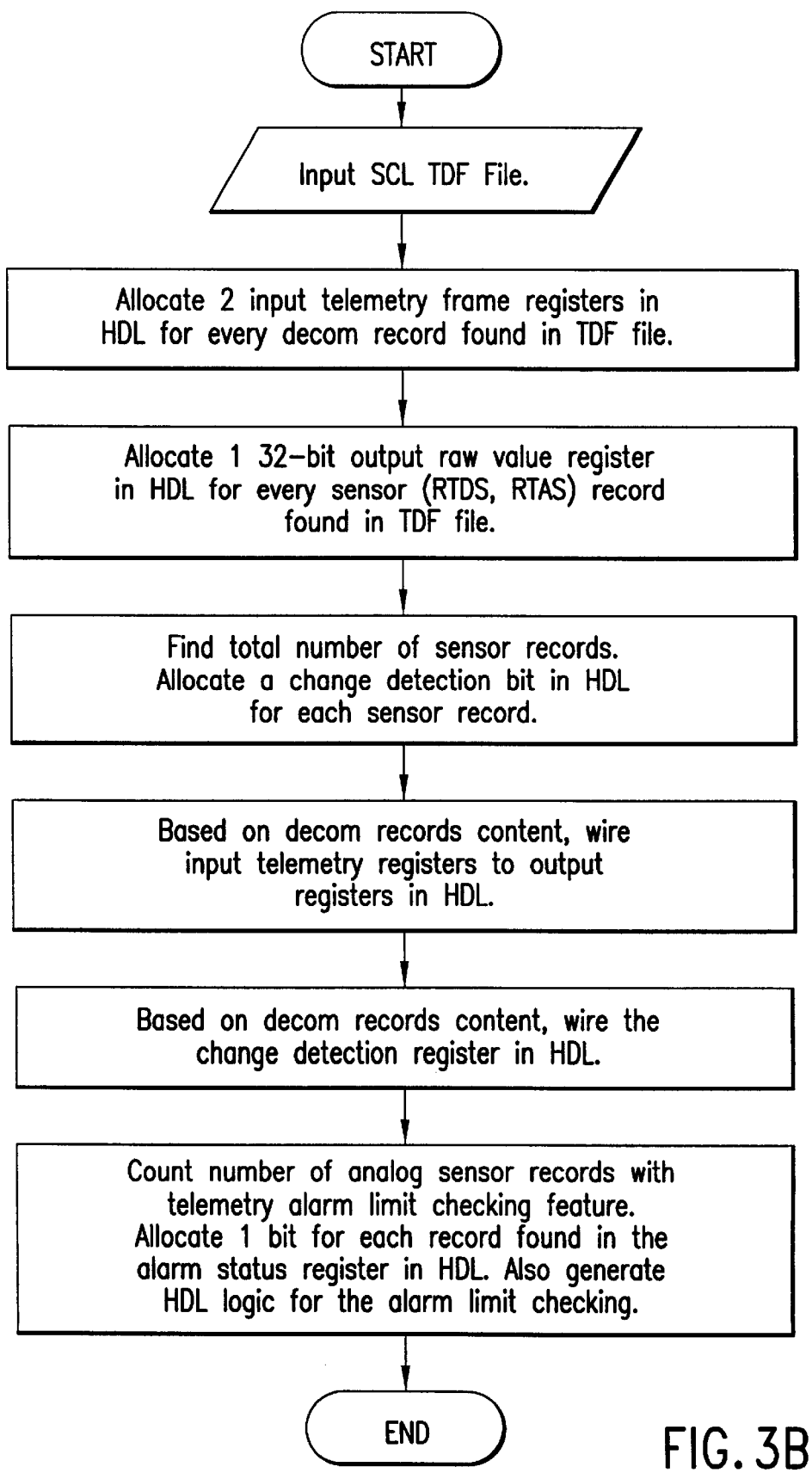
FIG. 3B is a flow-chart illustrating the steps performed during a first stage in converting from SCL to HDL in an exemplary application of one embodiment of the present invention.
Figure 3C:
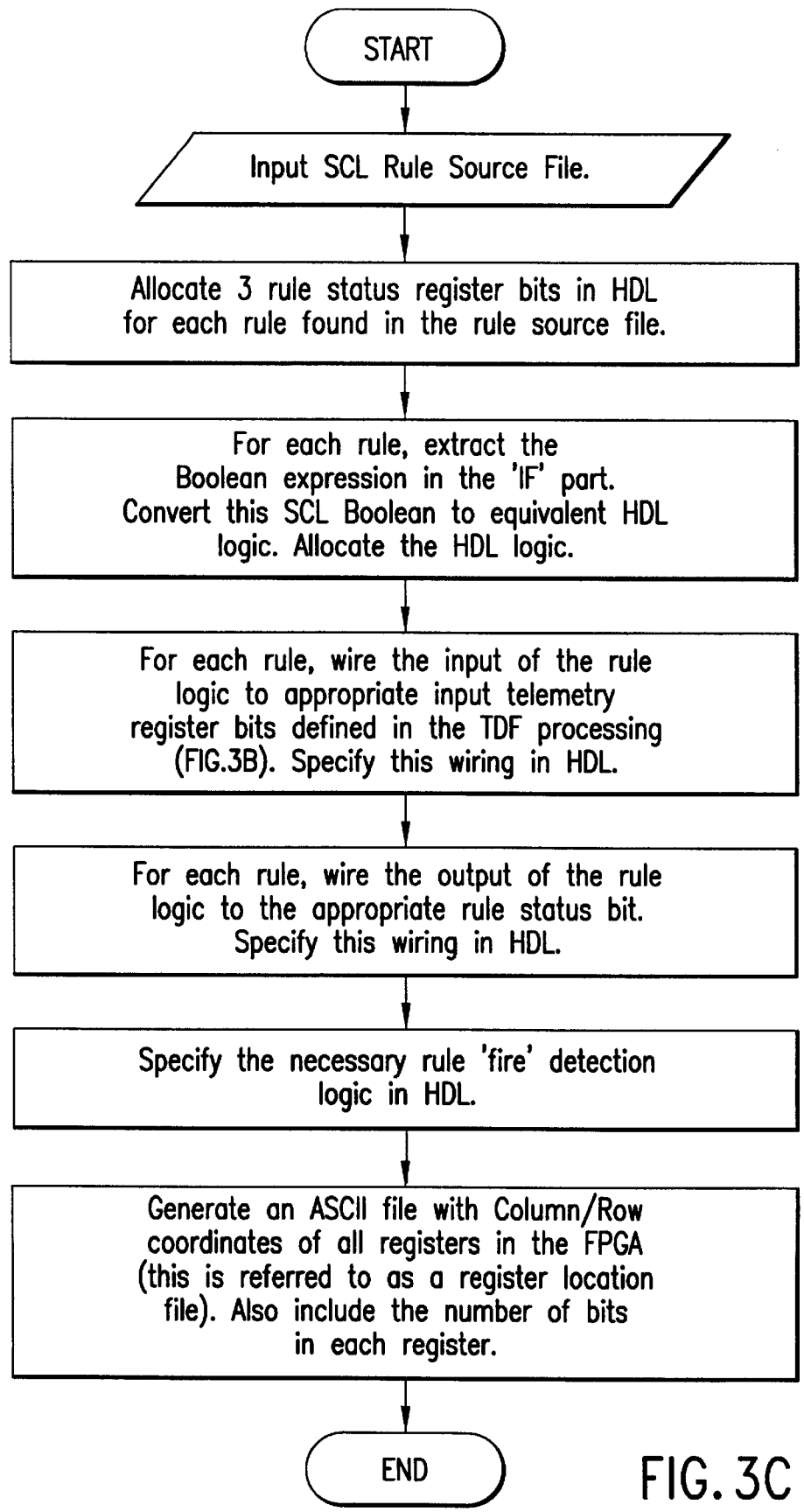
FIG. 3C is a flow-chart illustrating the steps performed during a second stage in converting from SCL to HDL in an exemplary application of one embodiment of the present invention.

An important feature of the present invention is the partitioning of the 'IF' and 'THEN' parts of the rules to be processed. The partitioned 'IF' part requires an evaluation effected by a rule-gate equivalent and, therefore, is passed SCL-to-HDL translator 376. The 'THEN' part of each rule requires no such evaluation via a rule-gate equivalent. This part is accordingly converted to an implicit script thread and, as such, compiled by SCL script compiler 373 and processed outside the given rule processing module 200, by system controller 375. In the illustrative embodiment shown in FIG. 3A, SCL-to-HDL translator 376 effects the translation in two stages. In the first stage of translation, translator 376 generally receives the necessary records of TDF file 372 and generates the required register allocations in HDL. Also within the first stage, translator 376 defines in HDL, based on the TDF file records, the hardware necessary for telemetry decommutation and telemetry change detection. In the second stage, translator 376 receives the contents of SCL rule source file 371 and defines therefrom the HDL necessary to establish and couple together the rule-gate equivalents, rule status register, and rule fire detection register. The functional steps in the first and second stages are shown, respectively, in more detail in FIGS. 3B and 3C. A sample HDL file generated in the manner shown for illustrative purposes in FIG. 3D.

Figure 3E:
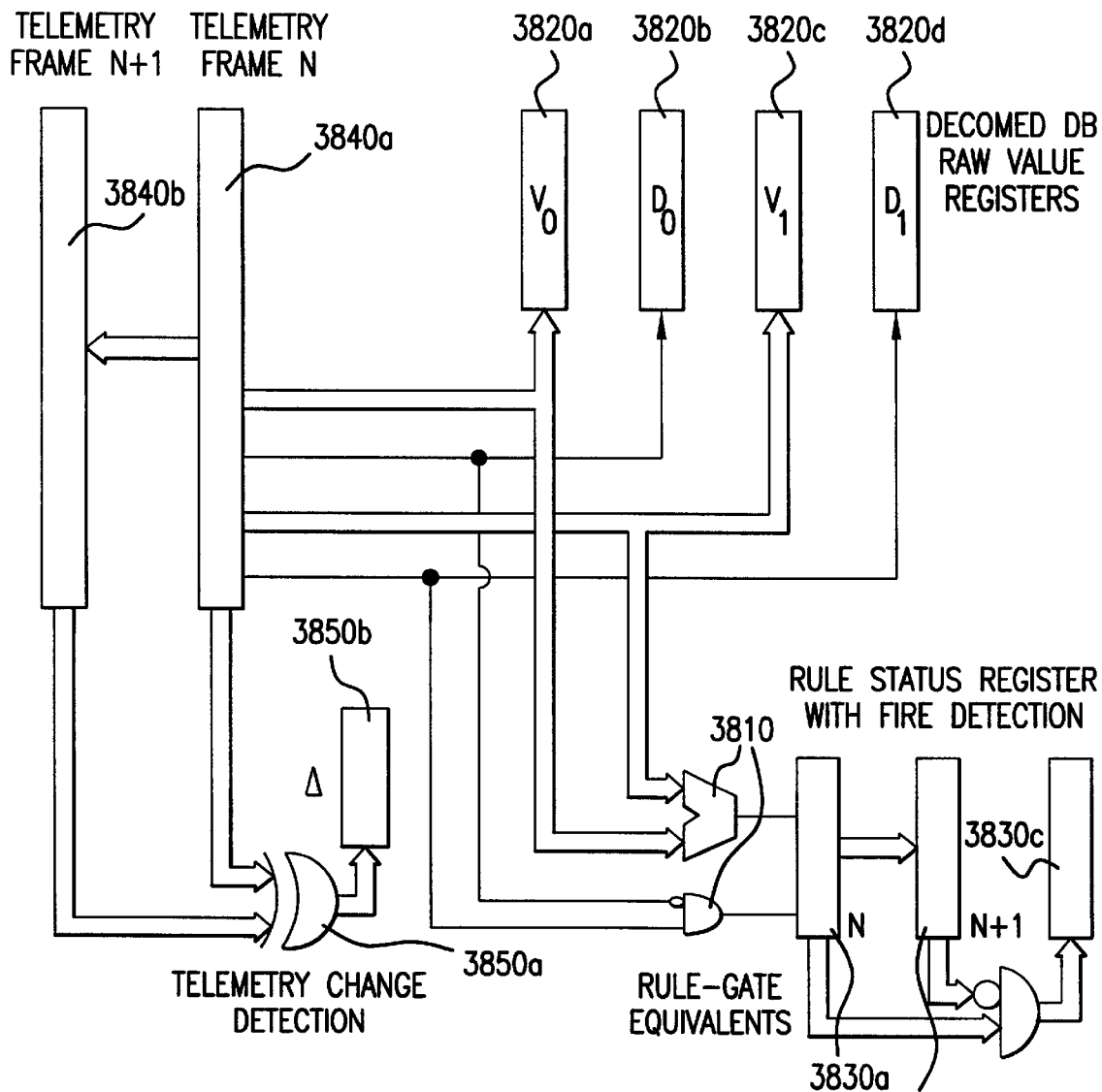
FIG. 3E is an illustrative schematic diagram of one embodiment of the rule processing module of the present invention, in an exemplary configuration.

Referring to FIG. 3E, there is shown a schematic diagram illustrating one embodiment of rule processing module 200, as configured on programmable device 380 in accordance with the exemplary HDL file shown in FIG. 3D. Processing of a rule partitioned in the manner described occurs as follows. The rule-gate equivalent 3810 corresponding to the 'IF' part is hardwired on the given programmable device 380 to the appropriate bits in telemetry register 3840a allocated on that programmable device 380. Once all of the rule-gate inputs are satisfied, the hardwired rule gate 3810 assumes an ON state. This ON state is entered as the current rule status in a rule status register 3830a also allocated on the given programmable device. Where the current rule status bit represents a change in state (as indicated by logic combination with a prior status in register 3830b); a rule fire detection is entered in fire detection register 3830c. The controller (which continuously polls the fire detection register 3830c for any ON bits) then executes the implicit script thread for the partitioned 'THEN' part corresponding to the rule gate-represented 'IF' part in question.

Also shown in FIG. 3E is the parsing or decommutation wiring. Essentially, the appropriate bit groups from input telemetry register 3840a are extracted and moved to a corresponding output register 3820a, 3820b, 3820c, and 3820d (in the manner illustrated in FIG. 2B).

Another feature shown in FIG. 3E is that of telemetry change detection. A current telemetry frame is held in register 3840a, and a previous telemetry frame is held in register 3840b. A series of exclusive OR gates in block 3850a provide a digital difference operation whose results are stored in change register 3850b. The resulting configuration generally shown in FIG. 3E is substantially described by the exemplary HDL of FIG. 3D.

Referring back to FIG. 3A, the script token streams in file 374 of the illustrative application shown are generated in a format readily recognized by an interpreter program executed in controller 375. Script references to database elements are represented in those script token streams by a resource identification number rather than by the original mnemonics of the database. A mapping between the particular database mnemonics and the corresponding resource identification numbers must therefore be made in the script compilation. To facilitate the mapping, the contents of TDF file 372 are passed to SCL script compiler 373.

Also in the illustrative application shown, an SCL database image 383 is generated for controller 375 by compilation of TDF file 372 in an SCL database compiler 381. In preparing file 383, SCL database compiler 381 inputs a register location file 382 for the present configuration of the given programmable device. SCL database compiler 381 passes the file 383 to controller 375.

The series of steps described in FIG. 3 for controlling the configuration of rule processing module 200 is but one example of numerous other specific series of steps that may be incorporated in configuration control module 350. The necessary configuration code may alternatively be generated by a schematic capture capability known in the art. In those cases, however, the need to graphically map out a complex circuit may prove prohibitive in view of given resources.

Figure 4:
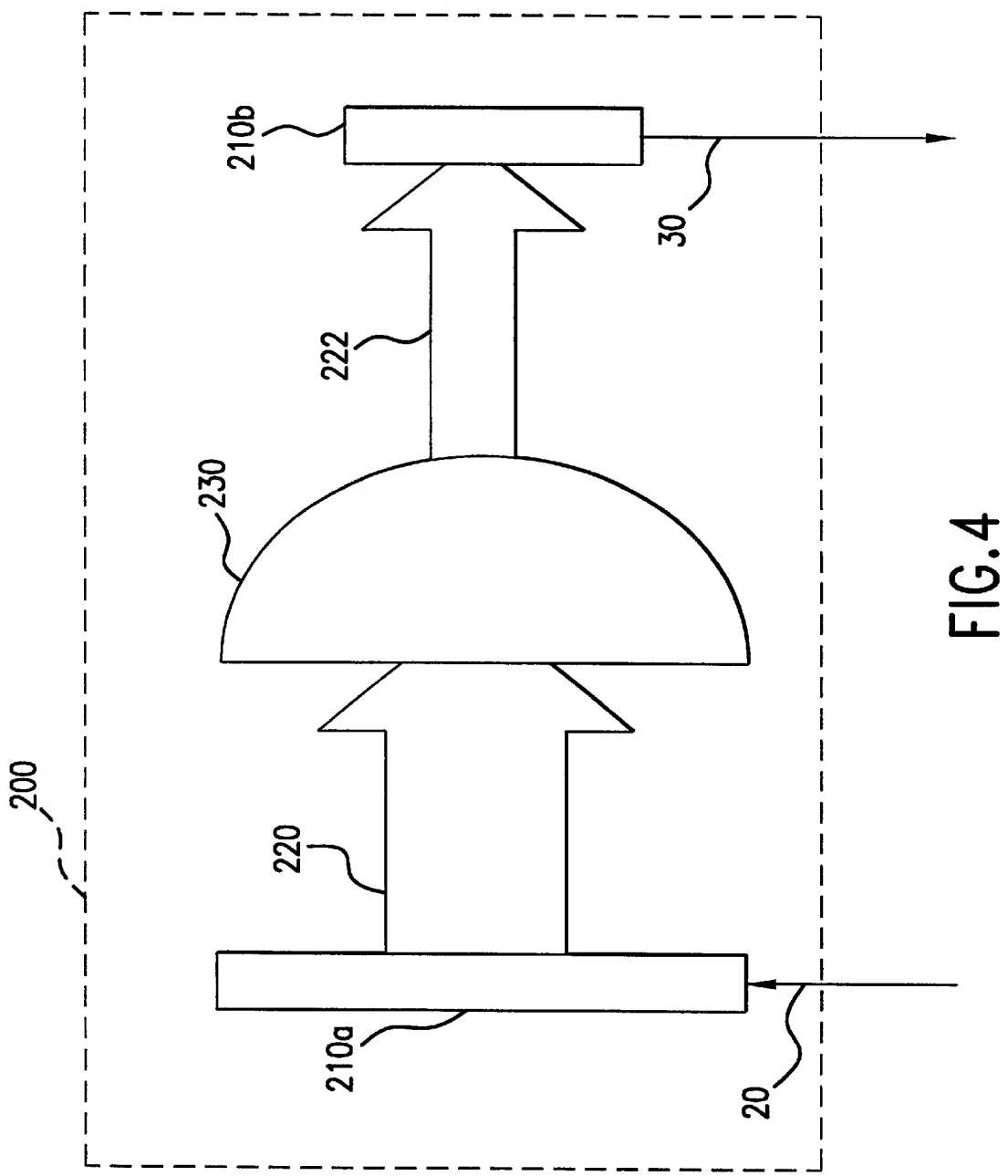
FIG. 4 is a schematic diagram broadly illustrating the main portions of a rule processing module in an embodiment of the present invention.

Referring now to FIG. 4, there is shown a schematic diagram generally illustrating the portions of rule processing module 200 configurably established by system controller and configuration control modules 300, 350. In accordance with the present invention, the portions configurably established include, in addition to logic inference portion 230, internal working memory portions 210a, 210b and interconnect portions 220, 222 which serve to electrically couple the working memory portions 210a, 210b to inference logic portion 230.

Generally, working memory portions 210a, 210b may be reconfigurably formed on the given programmable device by any suitable number of separately allocated registers. In programmable devices presently available, such as the Xilinx XC6216 FPGA chip, the capability is available to allocate a plurality of memory-mapped registers which may be multi-bit accessed. Each allocated register is designated by unique address information such that a controller may access any of the allocated registers at random by use of a software pointer, and to do so up to 32 bits at a time. This capability is currently exploited in the field of reconfigurable computing. FIG. 4B illustrates the general computer architecture in which an FPGA or CPLD device is coupled to a microprocessor via a memory bus; and, FIG. 4C illustrates how the various registers in the FPGA or CPLD device may be accessed (memory writes or reads) from the microprocessor. The multi-bit access capability, however, is not available except on the most advanced programmable devices. Moreover, the capability, even if available, cannot be exploited in applications permitting only serial-type computer interfaces.

Figure 4A:
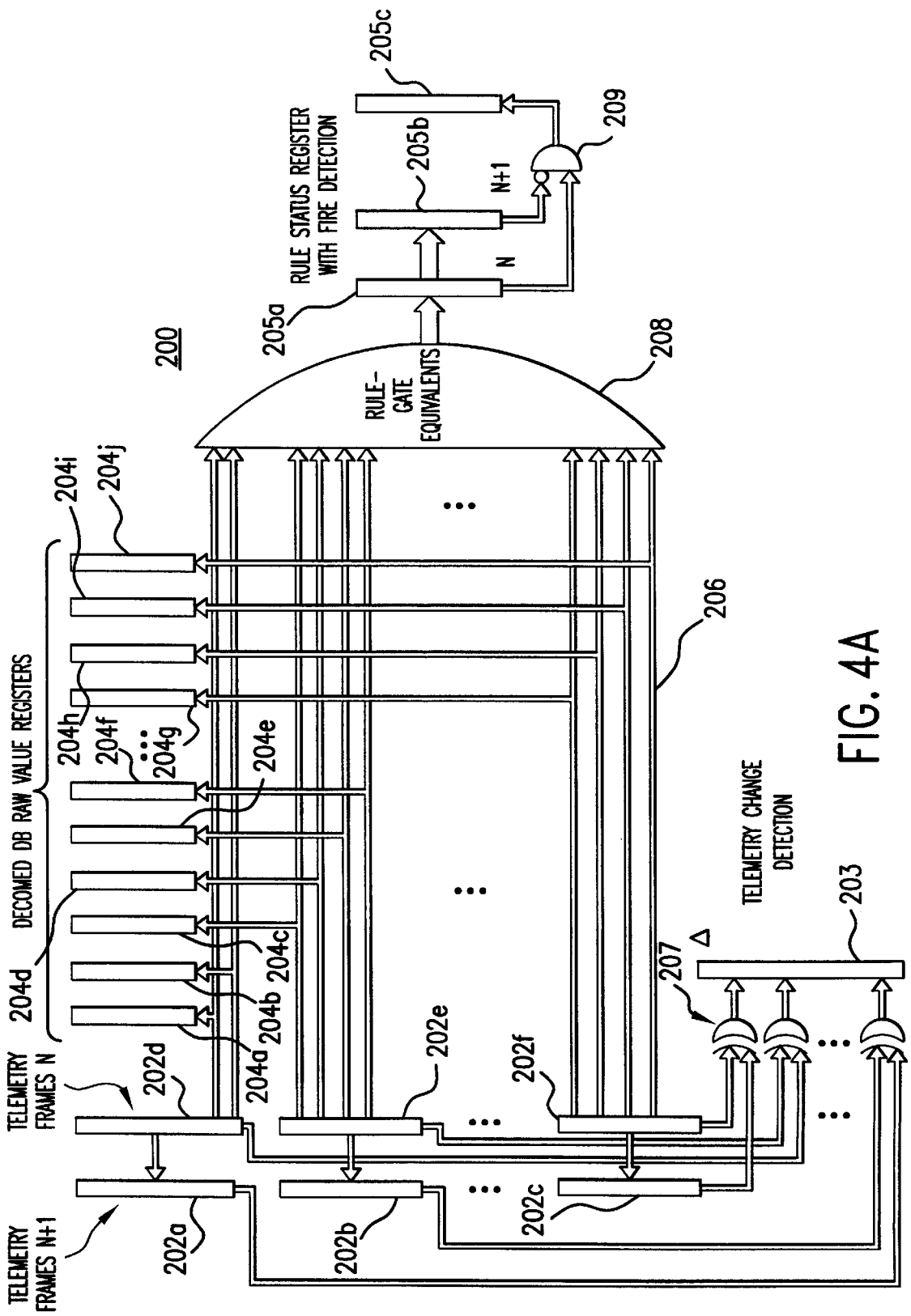
FIG. 4A is a schematic diagram illustrating the rule processing module, as configured in a first alternate embodiment of the present invention.
Figure 4B:
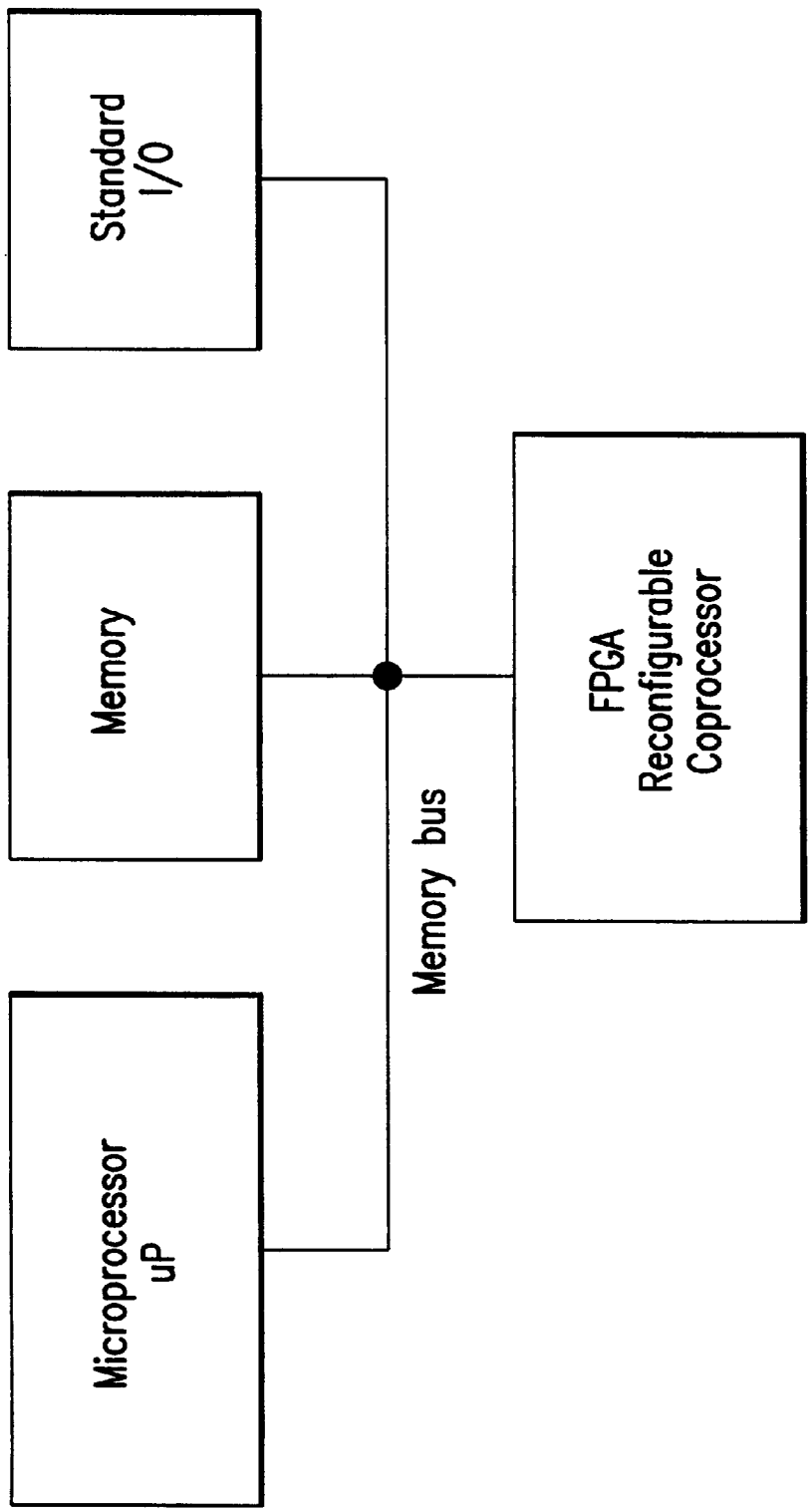
FIG. 4B is a block diagram illustrating one aspect of an exemplary computer architecture by which a programmable device configured in accordance with the present invention may be coupled to a computer system.
Figure 4C:
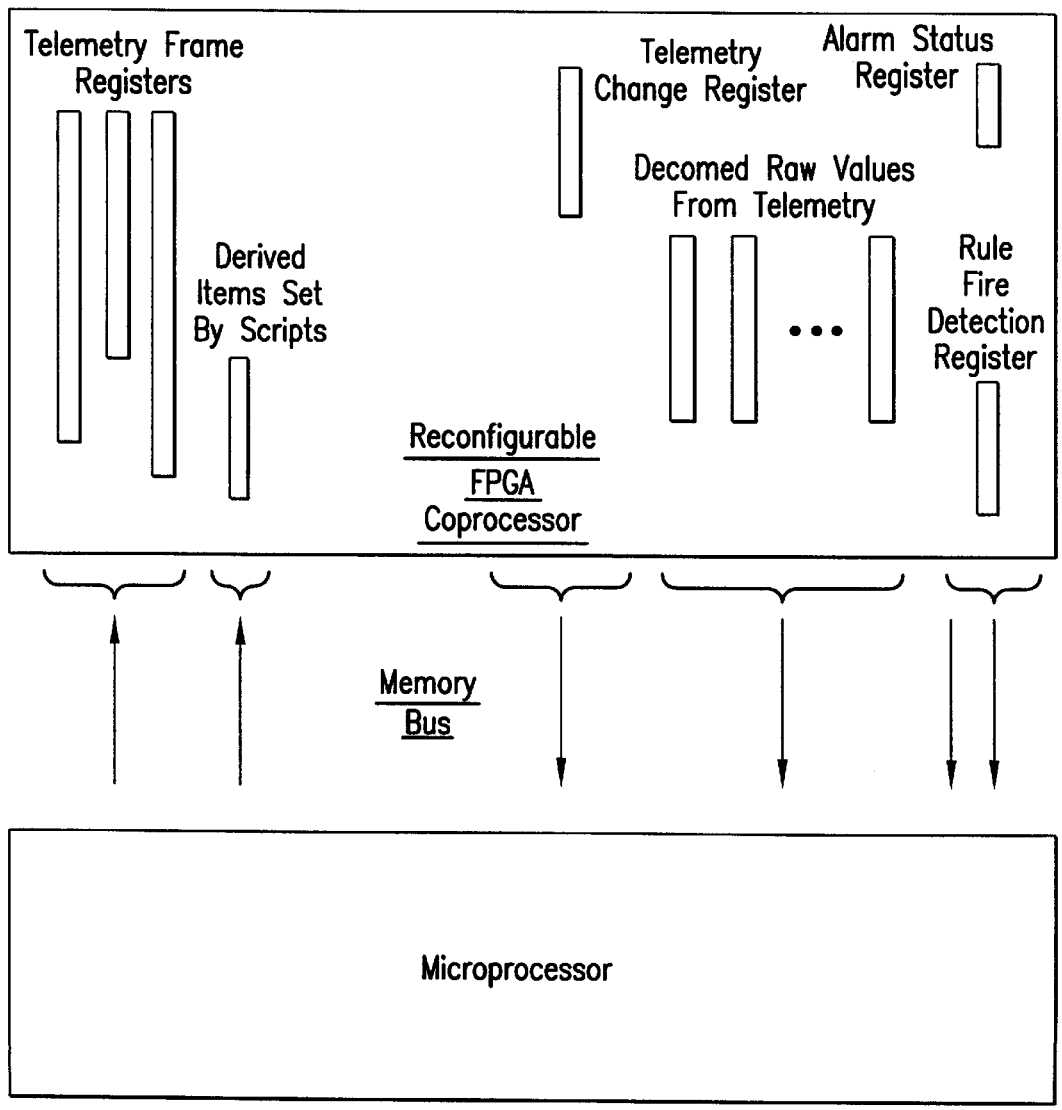
FIG. 4C is a schematic diagram illustrating the accessing by a microprocessor of registers established in a programmable device in one embodiment of the present invention.

A rule processing module 200' thus configured in a first alternate embodiment of the present invention with a plurality of memory-mapped registers formed thereon is shown in FIG. 4A. In this alternate embodiment, the internal working memory portions are defined by memory-mapped telemetry frame registers 202a–202f, telemetry change detection register 203, raw value registers 204a–204j, rule status registers 205a–205b, and rule fire detection register 205c. These registers are preferably established as 32-bit accessible registers, each being individually addressable by controller module 300. They are interconnected by a reconfigurable interconnect portion indicated generally by conduction wiring 206. Registers 202a–202f, 203, 204a–204j, and 205a–205c are also reconfigurably interconnected with an inference logic portion defined collectively by gates 207, 208, and 209 configured respectively to carry out predetermined event-driven functions. Note that direct connections between various combinations of allocated registers, such as between telemetry frame registers 202a–202f and raw value registers 204a–204j, provide ready accessibility to decommutated data, thereby facilitating data reduction.

In one embodiment of rule processing module 200, single-bit serial I/O (input/output) registers are utilized rather than memory-mapped multi-bit, random access registers. In such serial I/O embodiment, internal working memory portion 210a is formed as a serial-in-parallel-out (SIPO) shift register that receives a serialized input data stream 20, while working memory portion 210b is formed as a parallel-in-serial-out (PISO) shift register which generates a serialized output data stream. Where a programmable device having the multi-bit accessible memory-mapped register capability is employed, the necessary number of memory-mapped registers may be allocated in cascade to form each of the SIPO and PISO shift registers. Input and output shift registers 210a, 210b, although automatically configurable—as are the other portions 220, 222, 230—is reconfigured with much less frequency in most applications. Where possible with this embodiment, reconfiguration of shift registers 210a, 210b is avoided, and interconnect portions 220, 222 are appropriately reconfigured to access only those bits of shift registers 210a, 210b that are necessary.

Figure 5:
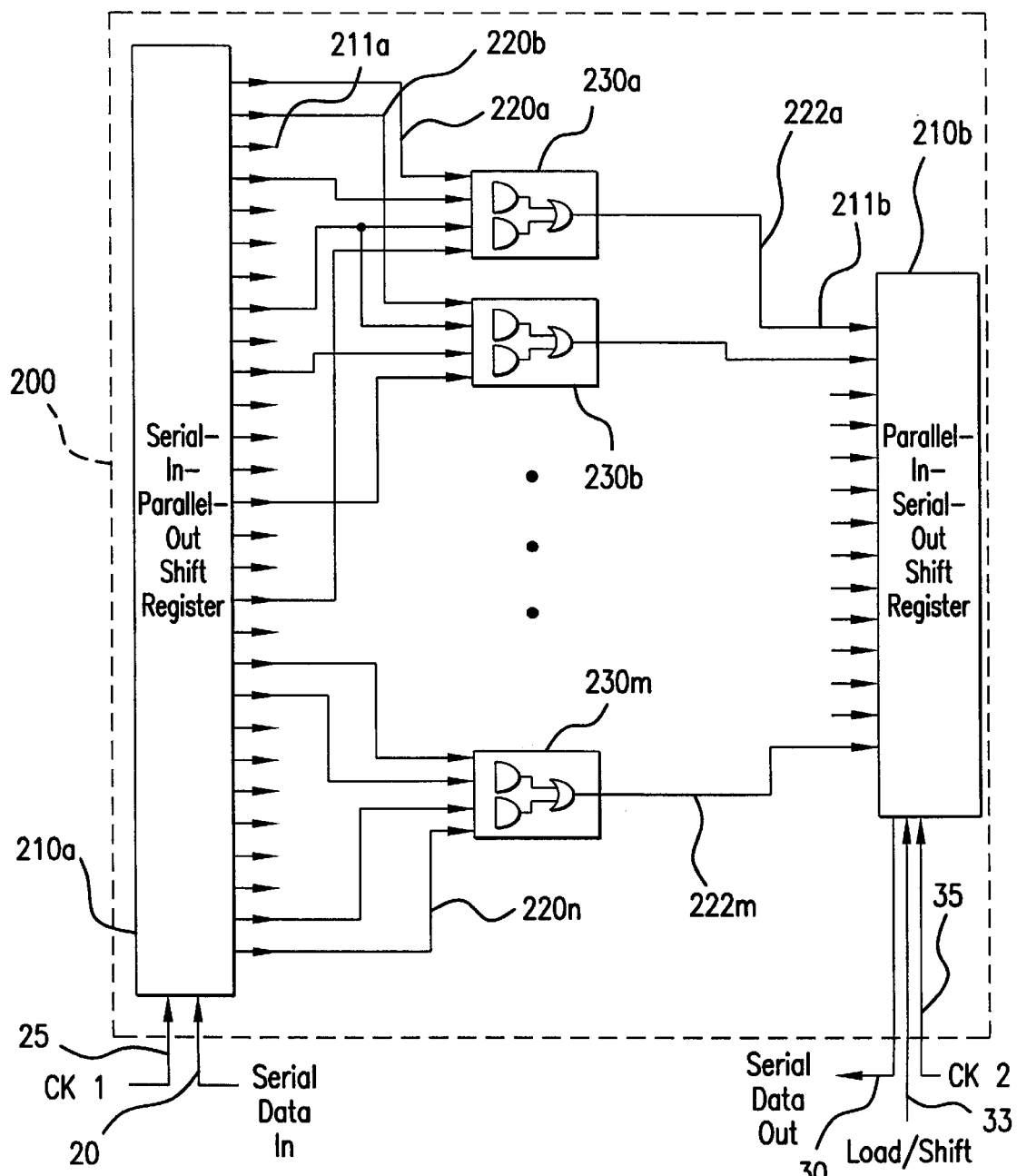
FIG. 5 is a detailed schematic diagram illustrating an exemplary configuration of the rule processing module embodiment shown in FIG. 4.

Referring now to FIG. 5, there is shown a more detailed schematic diagram illustrating the serial I/O embodiment of rule processing module 200 having its functional portions reconfigurably established in accordance with the present invention. Inference logic portion 230 is formed by a plurality of parallel logic cells 230a, 230b, . . . 230m. In the exemplary devices employed, each logic cell 230a, 230b, . . . 230m may be separately implemented in a macro cell (Xilinx XC40125, XC6216 FPGA chip, or the like) or in corresponding hardware look-up tables, or LUTs (Altera FLEX 10k CPLD chip or the like).

Preferably, the device employed is of such capacity that input shift register 210a may be configured with a bit length on the order of 1000 bits. Input shift register 210a thus provides a great number of parallel output bits 211a to which a plurality of input interconnections 220a–220n may selectively couple the respective inputs of logic cells 230a–230m. Significantly, a massive internal data bus may effectively be formed thereby to enable the concurrent performance of given rule inferences responsive to a first clock input signal 25.

Output shift register 210b is typically configured such that its bit length is less than that of input shift register 210a, as the number of rule outputs at the respective inference cells 230a–230m is less than the rule inputs. The available input data bit inputs 211b of register 210b is selectively coupled to the respective outputs of inference cells 230a–230m by a plurality of corresponding output interconnects 222a–222m. The inference rule outputs collected at output shift register 210b (responsive to a load/shift signal 33) are then read out in a serialized output data stream 30 responsive to a second clock signal 35.

Where mere decommutation of a data element received in the input telemetry frame is desired, a direct interconnect path is routed from input shift register 210a to output shift register 210b. While not shown, it is to be understood that one or more such direct connections may be formed on rule processing module 200 to reconfigurably define at least a portion of the parsing component 500.

An important feature of the present invention is that each portion of rule processing module 200 shown is established in readily reconfigurable manner. It may not be advantageous to reconfigure shift registers 210a, 210b with the frequency that inference cells 230a–230m and interconnects 220a–220n, 222a–222m may be reconfigured; however, it is nevertheless important that they too be configurable. The input SIPO shift register 210a is preferably of such width (bit length) that selected combinations of data bits shifted therein may be accessed by interconnects 220a–220n for various rule sets implemented by inference cells 230a–230m.

Implementation as such of a given rule set in an equivalent circuit incorporates the modeling of expert system rule firings which occur when the respective conditions of the given rule's IF part are satisfied with the on-switching of the equivalent logic circuit gates. That is, an expert rule firing is represented by a positive edge transition of the equivalent gate's output signal. This edge transition is preferably captured by a RS flip-flop (forming a part of output shift register 210b). It is important to note in this regard that the de-assertion, or removal of rule firing conditions, is of little processing consequence in expert systems. Consequently, negative edge transitions of given gate outputs are not stored.

Figure 6:
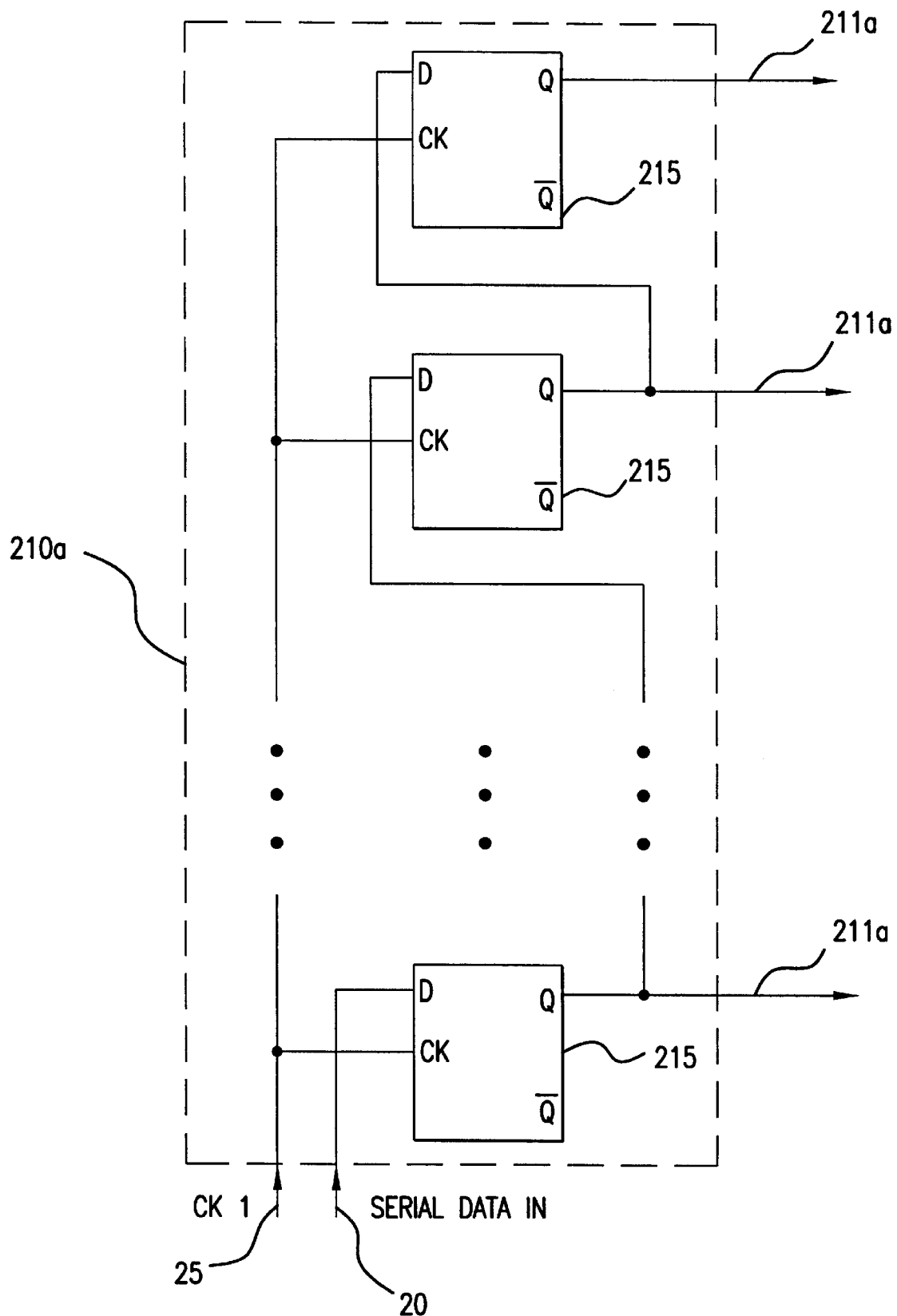
FIG. 6 is a detailed schematic diagram illustrating a configuration of a portion of the rule processing module of the present invention shown in FIG. 5.

Turning next to FIG. 6, there is shown a schematic diagram illustrating SIPO shift register 210a configurably established according to one embodiment of the present invention. SIPO register 210a is configured to include a plurality of D-type flip-flops 215 serially coupled as shown such that incoming serial data 20 is latched into the bottom-most D-flip-flop 215 on an appropriate transition of input clock signal 25. On like transitions of clock signal 25, thereafter, input data signal 20 is progressively shifted up the D-type flip-flop chain until an input data frame is shifted into flip-flops 215. A plurality of output data bits 211a are thus made available in parallel for access at subsequent time intervals. Note that other devices such as JK-type flip-flops may be utilized in place of the D-type flip-flops 215 shown, or that other devices such as supplemental multiplexers may be coupled to the D-type flip-flops 215 to implement SIPO register 210a. The particular choice of such implementations for shift register 210a is not important to the present invention.

Figure 7:
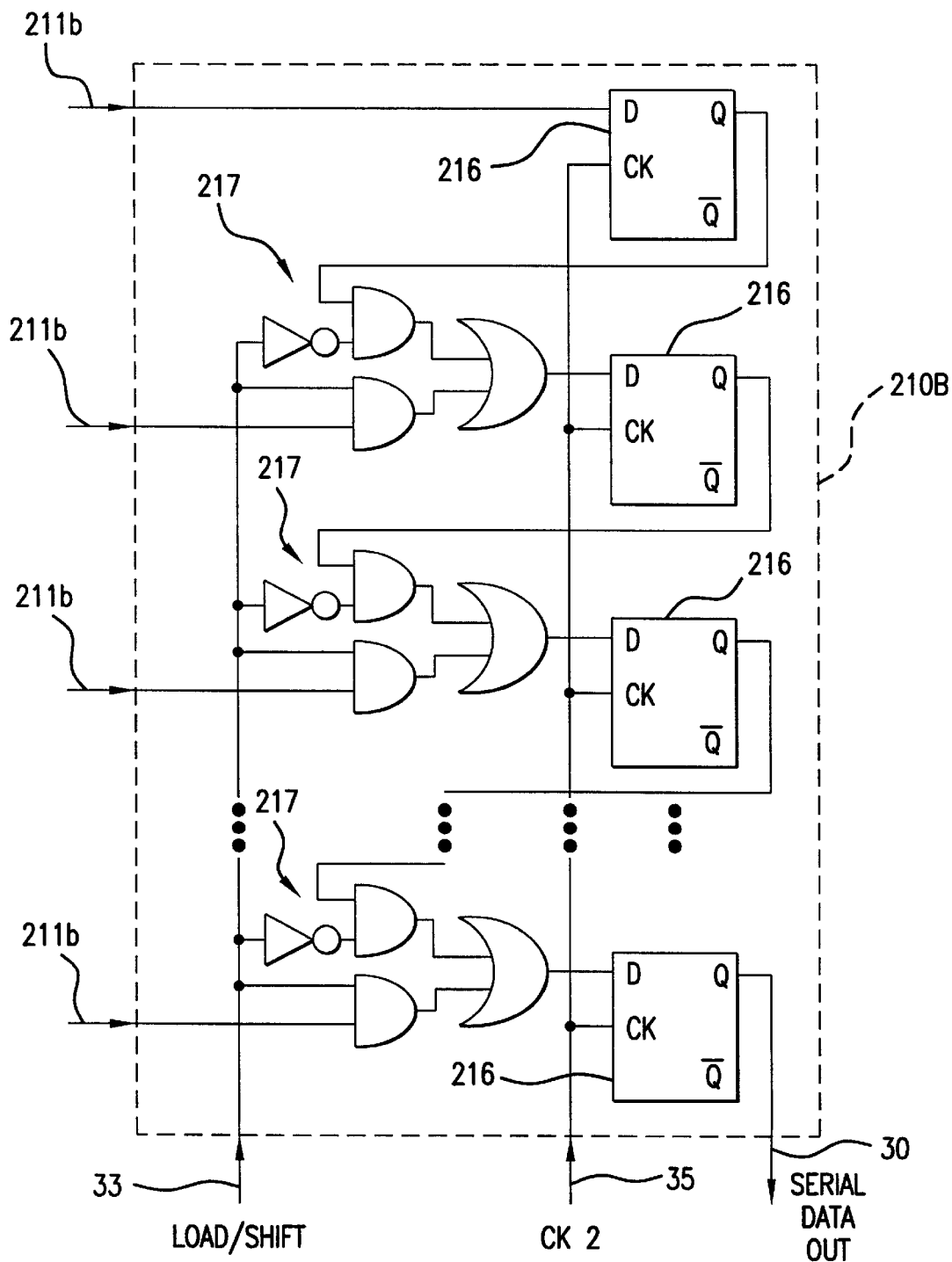
FIG. 7 is a detailed schematic diagram illustrating a configuration of another portion of the rule processing module of the present invention shown in FIG. 5.

Turning next to FIG. 7, there is shown a schematic diagram of PISO output shift register 210b configurably established in one embodiment of the present invention. PISO shift register 210b is configured to include a plurality of D-type flip-flops 216. With the exception of the top-most flip-flop 216, each flip-flop 216 has coupled thereto a 2×1 multiplexer circuit 217. Multiplexer circuits 217 serve, responsive to input load/shift mode control signal 33, to switch respective ones of D-type flip-flops 216 between a parallel input load mode and a serial output mode. With multiplexers 217 setting their corresponding flip-flops 216 to parallel load mode, the output signals arriving from inference cells 230a–230m over interconnects 222a–222m are received at input lines 211b and latched into the respective flip-flops 216 upon the occurrence of an appropriate transition of input clock signal 35. When multiplexer circuits 217 are accordingly actuated thereafter by command signal 33, flip-flops 216 are switched to shift out the data parallel-loaded therein in accordance with a series of input clock signal 35 transitions. A serialized data output stream 30 is thus generated.

Figure 8:
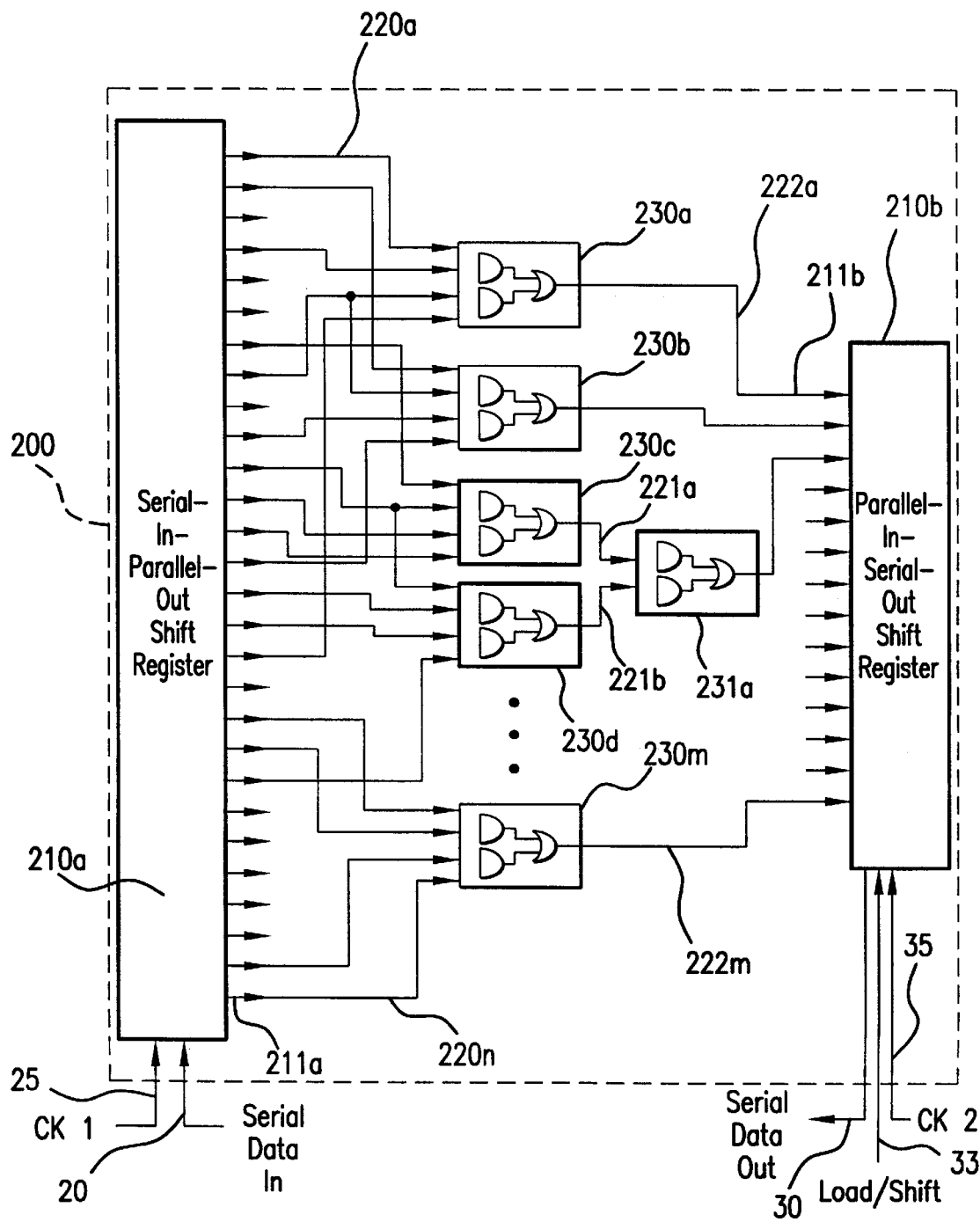
FIG. 8 is a detailed schematic diagram illustrating an alternate configuration of the rule processing module embodiment shown in FIG. 4.
Figure 9:
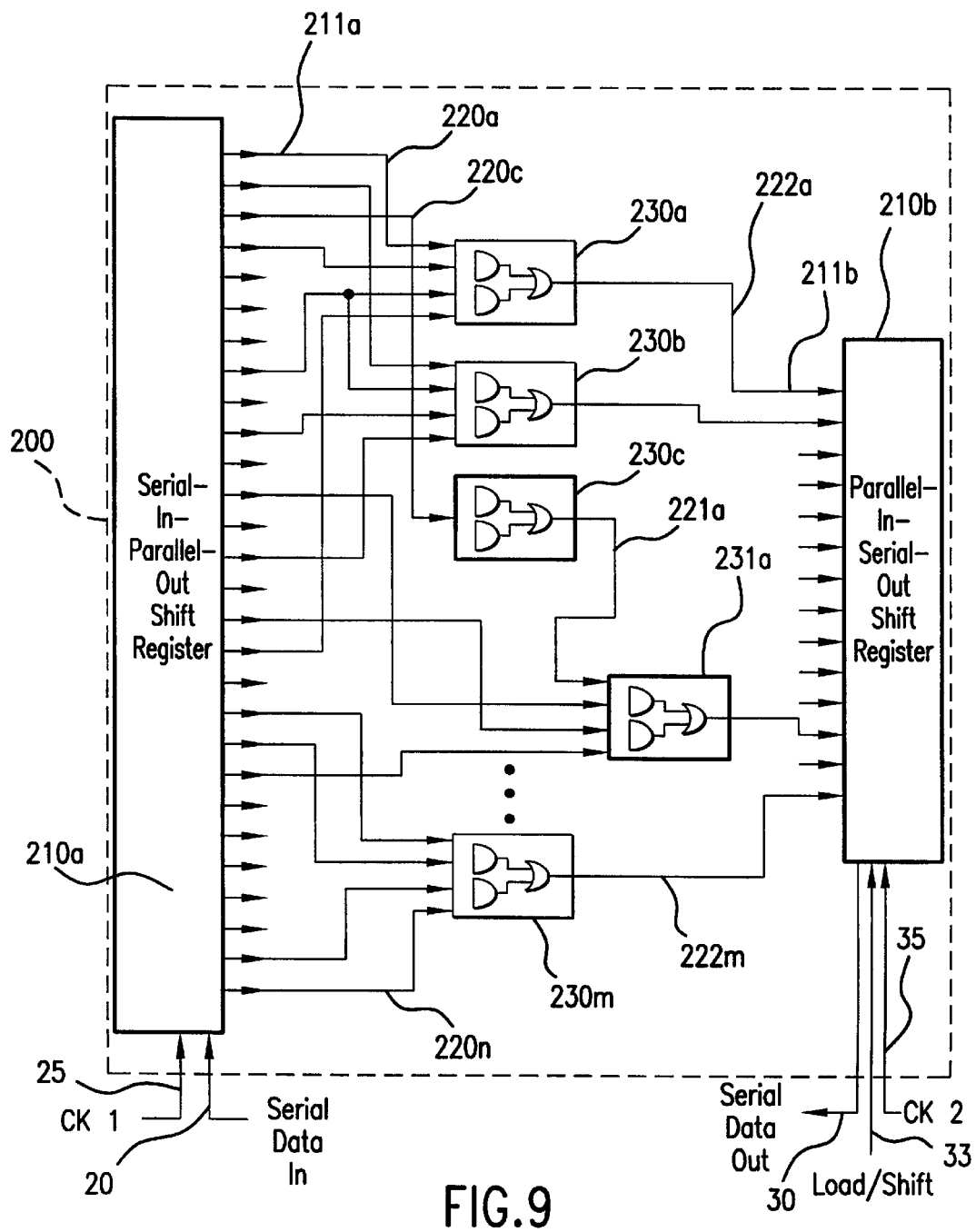
FIG. 9 is a detailed schematic diagram illustrating an alternate configuration of the rule processing module embodiment shown in FIG. 4; and, FIG. 10 is a schematic diagram generally illustrating the configuration of a rule processing module in an alternate embodiment of the present invention.

In the embodiment of rule processing module 200 shown in FIG. 5, a single stage of parallel inference cells 230a–230m is configurably established. In accordance with the present invention, however, multiple stages of such inference cells may also be configurably established where necessitated by a given application. Examples of multiple cascaded stages of inference cells are shown in FIGS. 8–9. In FIG. 8, an inference cell 231a is coupled in cascade to inference cells 230c and 230d via interconnects 221a and 221b. In FIG. 9, inference cell 231a is coupled in cascaded manner to inference cell 230c whose output signal it receives as an input via interconnect 221a. Cell 231a also receives other inputs directly from SIPO shift register 210a. The use of multiple inference cell stages in this manner vastly expands the complexity of rule sets that may be implemented in rule processing module 200.

While each additional stage of inference cells extends the required processing time by an additional propagation delay interval, the effect is in practice inconsequential. The output sampling period for rule processing module 200 in typical applications ranges on the order of microseconds to milliseconds. The applicable propagation delays in typical devices to be employed range, on the other hand, on the order of nanoseconds. More generally, uneven propagation delays through parallel inference cells of even a common processing stage is similarly inconsequential, as inference cell outputs are parallel-loaded into PISO output shift register 210b in a synchronous manner—after all propagation delays have long transpired.

Factors other than logic interconnection layout may urge the use of multiple inference cell stages. For instance, physical constraints such as limited interconnect length may require an intermediate inference cell to serve effectively as a bridge for interconnection to an inference cell in a subsequent stage. This is actually the case illustrated in FIG. 9, wherein one of the four input signals required by inference cell 231a is made available in the embodiment shown at a distant upper portion of input SIPO shift register 210a. Given that interconnect 220c coupled to the appropriate SIPO shift register output 211a is physically of insufficient length to reach inference cell 231a, that interconnect 220c is routed instead to intermediate reference cell 230c. Interconnect 221a is then routed between the output of intermediate cell 230c and the given input of inference cell 231a.

Figure 10:
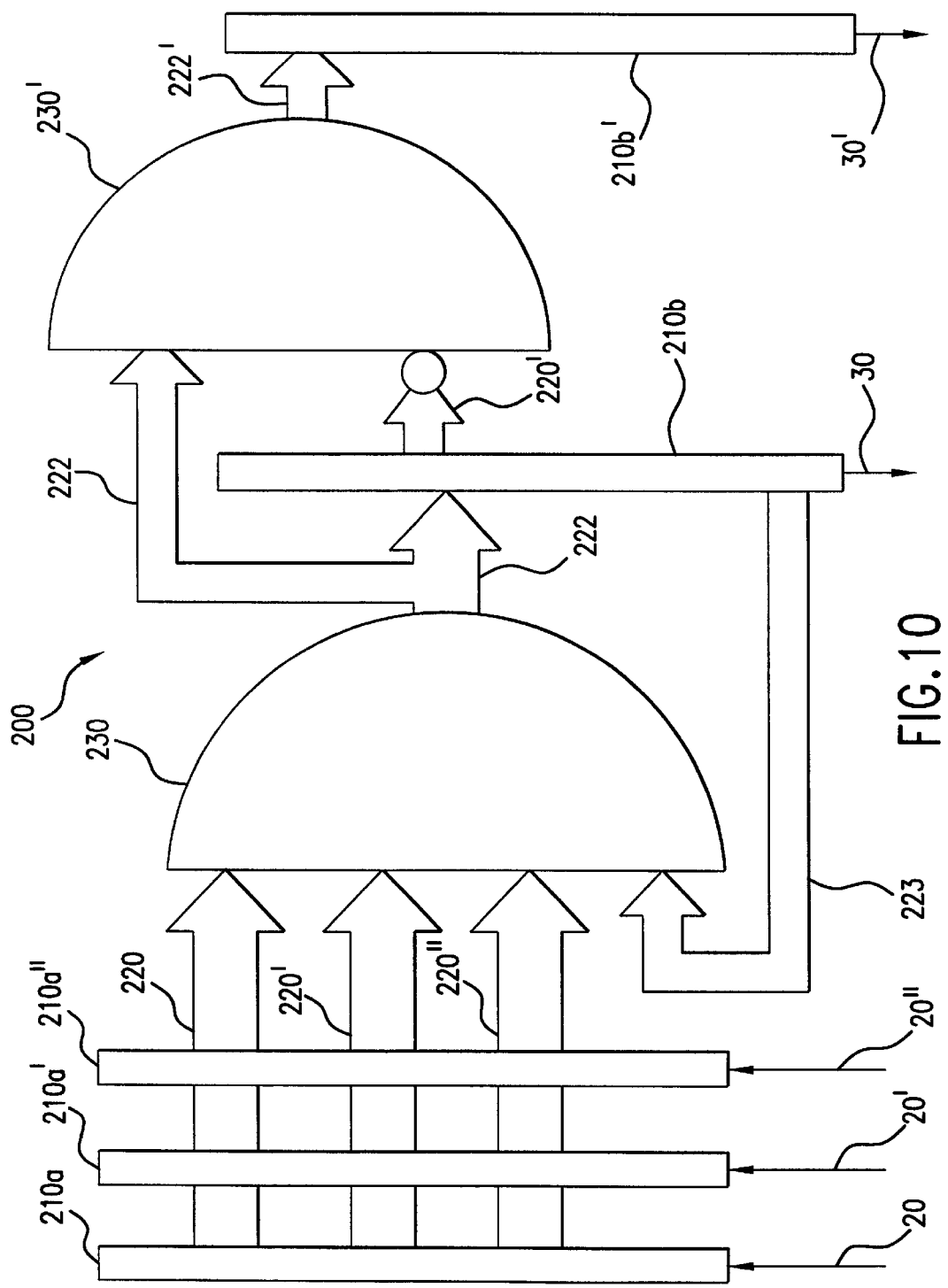

Referring now to FIG. 10, there is shown a schematic diagram generally illustrating rule processing module 200 configurably established in accordance with an alternate embodiment of the present invention. Rule processing module 200 in this configuration includes a plurality of input SIPO shift registers 210a, 210a', 210a", in which a plurality of data sets derived respectively from input data streams 20, 20', and 20" are made concurrently available for a first inference portion 230. In a spacecraft command and control application, three separate telemetry frame data sets may, for instance, be stored respectively in SIPO shift registers 210a–210a". The telemetry data frames are then available for either concurrent or time-displaced access by first inference logic portion 230 via input interconnect portions 220, 220', and 220".

Rule processing module 200 also includes in this embodiment a second inference logic portion 230' which may be coupled in cascade as shown to facilitate rule fire detection. Inference logic portion 230' is coupled to operate upon data passed directly thereto from inference logic portion 230 via interconnect portion 222. Inference logic portion 230' is also coupled to operate upon data passed thereto from output shift register 210b via interconnect portion 220' which is adapted to selectively tap various data bit portions of register 210b. Second inference logic portion 230' is so coupled that its output may be passed via interconnect portion 222' to a second PISO shift register 210b' for generation of a second serialized output data stream 30'.

Rule fire detection requires first that a check be made of both the current state of a given rule and the immediately preceding state of that rule. When the check indicates that the current state is ONE, for instance, whereas the previous state was ZERO, a rule 'fire' is detected for the given rule. With rule processing module 200 realized as shown in FIG. 10, second inference logic portion 230' is adapted to effectively perform this check, and second PISO shift register 210b' is adapted to temporarily store the 'fire' state for the given rule.

Rule processing module 200 also includes in this embodiment a recursive processing feature. Portions of the output data loaded into first PISO output shift register 210b are selectively routed in feedback manner by interconnect portion 223 for input into first inference logic portion 230. This recursive operation enables prior rule results to be used in generating new rule results.

Although this invention has been described in connection with specific forms and embodiments thereof, it will be appreciated that various modifications other than those discussed above may be resorted to without departing from the spirit or scope of the invention. For example, equivalent elements may be substituted for those specifically shown and described, certain features may be used independently of other features, and in certain cases, particular combinations of functional steps may be reversed or interposed, all without departing from the spirit or scope of the invention as defined in the appended Claims.

What is claimed is:

1. A reconfigurable computing system for processing an input signal comprising:
    (a) a first processing module adapted to execute a script instruction responsive to at least a portion of said input signal, said first processing module generating a first output signal;
    (b) a reconfigurable second processing module adapted to execute a rule based evaluation responsive to at least a portion of said input signal, said second processing module generating a second output signal and including:
        (1) a working memory portion for temporary storage of at least a portion of said input signal and at least a portion of said second output signal;
        (2) a rule evaluation portion having a plurality of inference cells disposed in parallel, each of said inference cells being configured to generate an inference signal responsive to at least a portion of said input signal; and,
        (3) an interconnection portion for coupling together said working memory and said rule evaluation portions; and,
    (c) a controller module coupled to said first and second processing modules for actuating cooperative operation thereof, said controller module including means for automatically actuating reconfiguration to a predetermined hardwired form of said second processing module in accordance with predetermined processing logic, said controller module being adapted to generate configuration control data for said second processing module.

2. The reconfigurable computing system as recited in claim 1 wherein said second processing module further includes a configuration memory portion for storing said configuration control data.

3. The reconfigurable computing system as recited in claim 2 wherein said second processing module further includes means for self-reconfiguration responsive to said configuration control data.

4. The reconfigurable computing system as recited in claim 3 wherein said configuration control data generated by said controller module further includes predetermined parsing criteria.

5. The reconfigurable computing system as recited in claim 1 wherein said working memory portion of said second processing module has reconfigurably formed therein at least one input memory mapped register and at least one output memory mapped register.

6. The reconfiguration processing system as recited in claim 5 wherein each said memory mapped register is multi-bit accessible.

7. The reconfigurable computing system as recited in claim 5 wherein said input memory mapped register is configured in a serial-in-parallel-out shift register form and said output memory mapped register is configured in a parallel-in-serial-out shift register form.

8. The reconfigurable computing system as recited in claim 1 wherein each of said inference cells of said second processing module rule evaluation portion has reconfigurably formed therein at least one of a plurality of predetermined logic gate configurations.

9. The reconfigurable computing system as recited in claim 4 wherein at least a portion of said second processing module is formed on a programmable logic array device.

10. The reconfigurable computing system as recited in claim 9 wherein said working memory, rule evaluation, interconnection, and configuration memory portions of said second processing module are formed on said programmable logic array device.

11. The reconfigurable computing system as recited in claim 2 wherein said controller module means for automatically actuating reconfiguration of said second processing module includes:
  (a) a partitioning portion for partitioning said predetermined processing logic into rule processing and script processing partitions;
  (b) a first converting portion operably coupled to said partitioning portion for converting at least a portion of said rule processing partition to an equivalent logic gate set containing at least one of a plurality of predetermined logic gate configurations; and,
  (c) a second converting portion operably coupled to said first converting portion for converting said equivalent logic gate set to at least a portion of said configuration control data.

12. The reconfigurable computing system as recited in claim 11 wherein said second converting portion includes:
  (a) a translator for generating for said equivalent logic gate set a Hardware Description Language description; and,
  (b) a compiler operably coupled to said translator for compiling said Hardware Description Language description of said equivalent logic gate set to generate said portion of said configuration control data.

13. An automatically reconfigurable expert rule computing system for implementing predetermined processing logic having both a script processing partition and a rule processing partition comprising:
  (a) a script processing module for generating a first output signal responsive to at least a portion of an input signal in accordance with said script processing partition;
  (b) a reconfigurable rule processing module for generating a second output signal responsive to at least a portion of said input signal in accordance with said rule processing partition, said rule processing module including:
    (1) first and second working memory circuits for temporary storage therein, respectively, of at least a portion of said input signal and at least a portion of said second output signal, said first working memory circuit including a memory mapped input register, said second working memory circuit including a memory mapped output register;
    (2) a rule evaluation portion having a plurality of inference cells disposed in parallel, each of said inference cells being configured to generate an inference signal responsive to at least a portion of said input signal;
    (3) an interconnection portion for coupling together said working memory circuits and said rule evaluation portion; and,
    (4) a configuration memory portion coupled to said rule evaluation portion; and,
  (c) a controller module coupled to said script and rule processing modules for actuating cooperative operation thereof, said controller module including means for automatically actuating reconfiguration to a predetermined hardwired form of said rule processing module in accordance with said rule processing partition, said controller module being adapted to generate configuration control data for said rule processing module.

14. The reconfigurable computing system as recited in claim 13 wherein said rule processing module further includes means for self-reconfiguration responsive to said configuration control data.

15. The reconfigurable computing system as recited in claim 14 wherein said controller module means for automatically actuating reconfiguration of said rule processing module includes:
  (a) a partitioning portion for partitioning said predetermined processing logic into said rule processing and said script processing partitions thereof;
  (b) a first converting portion operably coupled to said partitioning portion for converting at least a portion of said rule processing partition to an equivalent logic gate set containing at least one of a plurality of predetermined logic gate configurations; and,
  (c) a second converting portion operably coupled to said first converting portion for converting said equivalent logic gate set to at least a portion of said configuration control data.

16. The reconfigurable computing system as recited in claim 15 wherein said second converting portion includes:
  (a) a translator for generating for said equivalent logic gate set a Hardware Description Language description; and,
  (b) a compiler operably coupled to said translator for compiling said Hardware Description Language description of said equivalent logic gate set to generate said portion of said configuration control data.

17. The reconfigurable computing system as recited in claim 16 wherein each of said inference cells of said rule processing module rule evaluation portion is defined by at least one of a plurality of predetermined logic gate configurations.

18. The reconfigurable computing system as recited in claim 17 wherein at least a portion of said rule processing module is formed on a programmable logic array device.

19. The reconfigurable computing system as recited in claim 18 wherein said working memory, rule evaluation, interconnection, and configuration memory portions of said rule processing module are formed on said programmable logic array device.

20. The reconfigurable computing system as recited in claim 19 wherein said working memory portion of said rule processing module has reconfigurably formed therein at least one input memory mapped register and at least one output memory mapped register.

21. The reconfigurable expert rule processing system as recited in claim 20 wherein each said memory mapped register is multi-bit accessible.

22. The reconfigurable computing system as recited in claim 19 wherein said working memory portion of said rule processing module has reconfigurably formed therein an input serial-in-parallel-out shift register and an output parallel-in-serial-out shift register.

23. The reconfigurable computing system as recited in claim 22 wherein said configuration control data generated by said controller module further includes predetermined parsing criteria.

24. A reconfigurable expert rule computing system for processing an input signal comprising:
   (a) a script processing module for generating a script processing output signal responsive to at least a portion of said input signal;
   (b) a reconfigurable rule processing module for generating at least one rule processing output signal responsive to at least a portion of said input signal, said rule processing module including:
      (1) at least one working memory portion for temporary storage therein of at least a portion of said input signal and at least a portion of said rule processing output signal;
      (2) at least one rule evaluation portion having a plurality of inference cells disposed in parallel, each of said inference cells being configured to generate an inference signal responsive to at least a portion of said input signal; and,
      (3) at least one interconnection portion for coupling together said working memory and said rule evaluation portions; and,
   (c) a controller module coupled to said script and rule processing modules for actuating cooperative operation thereof, said controller module including means for automatically actuating reconfiguration to a predetermined hardwired form of said rule processing module in accordance with predetermined processing logic, said controller module being adapted to generate configuration control data for said rule processing module, said automatic reconfiguration actuation means including:
      (1) a partitioning portion for partitioning said predetermined processing logic into rule processing and script processing partitions;
      (2) a first converting portion operably coupled to said partitioning portion for converting at least a portion of said rule processing partition to an equivalent logic gate set containing at least one of a plurality of predetermined logic gate configurations; and,
      (3) a second converting portion operably coupled to said first converting portion for converting said equivalent logic gate set to at least a portion of said configuration control data.

25. The reconfigurable computing system as recited in claim 24 wherein said second converting portion includes:
   (a) a translator for generating for said equivalent logic gate a Hardware Description Language description; and,
   (b) a compiler operably coupled to said translator for compiling said Hardware Description Language description of said equivalent logic gate set to generate said portion of said configuration control data.

26. The reconfigurable computing system as recited in claim 25 wherein said rule processing module includes a plurality of said rule evaluation portions coupled substantially in cascade, a portion of said rule processing output signal being fed back for input to at least one of said rule evaluation portions.

27. The reconfigurable computing system as recited in claim 26 wherein at least a portion of said rule processing module is formed on a programmable logic array device.

28. The reconfigurable computing system as recited in claim 27 wherein said working memory, rule evaluation, interconnection, and configuration memory portions of said second processing module are formed on said programmable logic array device.

* * * * *